United States Patent [19]
Shimizu et al.

[11] Patent Number: 5,341,049
[45] Date of Patent: Aug. 23, 1994

[54] INTEGRATED CIRCUIT HAVING ALTERNATE ROWS OF LOGIC CELLS AND I/O CELLS

[75] Inventors: Atsushi Shimizu; Satoru Isomura, both of Ome, Japan; Takeo Yamada, Boston, Mass.; Tohru Kobayashi, Iruma, Japan; Yoshuhiro Fujimura, Ome, Japan; Yuko Ito, Ome, Japan

[73] Assignee: Hitachi, Ltd., Tokyo, Japan

[21] Appl. No.: 916,430

[22] Filed: Jul. 21, 1992

[30] Foreign Application Priority Data

Jul. 22, 1991 [JP] Japan .................................. 3-180807

[51] Int. Cl.⁵ ............................................. H03K 19/177
[52] U.S. Cl. ............................. 307/482.1; 307/465.1; 307/303.1; 257/732
[58] Field of Search ............... 257/203, 732, 738, 780; 307/465–466, 465.1, 482.1, 480, 303.1

[56] References Cited

U.S. PATENT DOCUMENTS

| 4,780,846 | 10/1988 | Tanabe et al. | 257/203 X |
| 4,864,381 | 9/1989 | Seefeldt et al. | 257/203 |
| 5,239,215 | 8/1993 | Yamaguchi | 307/482.1 X |

FOREIGN PATENT DOCUMENTS

| 0098163 | 1/1984 | European Pat. Off. | 257/203 |
| 62-194640 | 8/1987 | Japan . | |

*Primary Examiner*—David R. Hudspeth
*Attorney, Agent, or Firm*—Pennie & Edmonds

[57] ABSTRACT

A semiconductor IC device has an input/output circuit and an internal logic circuit connected with the input/output circuit formed in a main surface of a semiconductor substrate of a generally rectangular shape. The input/output circuit is divided into at least two input/output circuit blocks in such a manner that edges of the logic circuit blocks defined by the division on the main surface of the substrate extend in a direction substantially parallel with a pair of opposite sides of the substrate. The internal logic circuit is divided into at least three logic circuit blocks in such a manner that edges of the logic circuit blocks defined by the division on the main surface of the substrate extend in the above-mentioned direction. Each of the input/output circuit blocks is sandwiched by and electrically connected with adjacently arranged two of the logic circuit blocks.

21 Claims, 19 Drawing Sheets

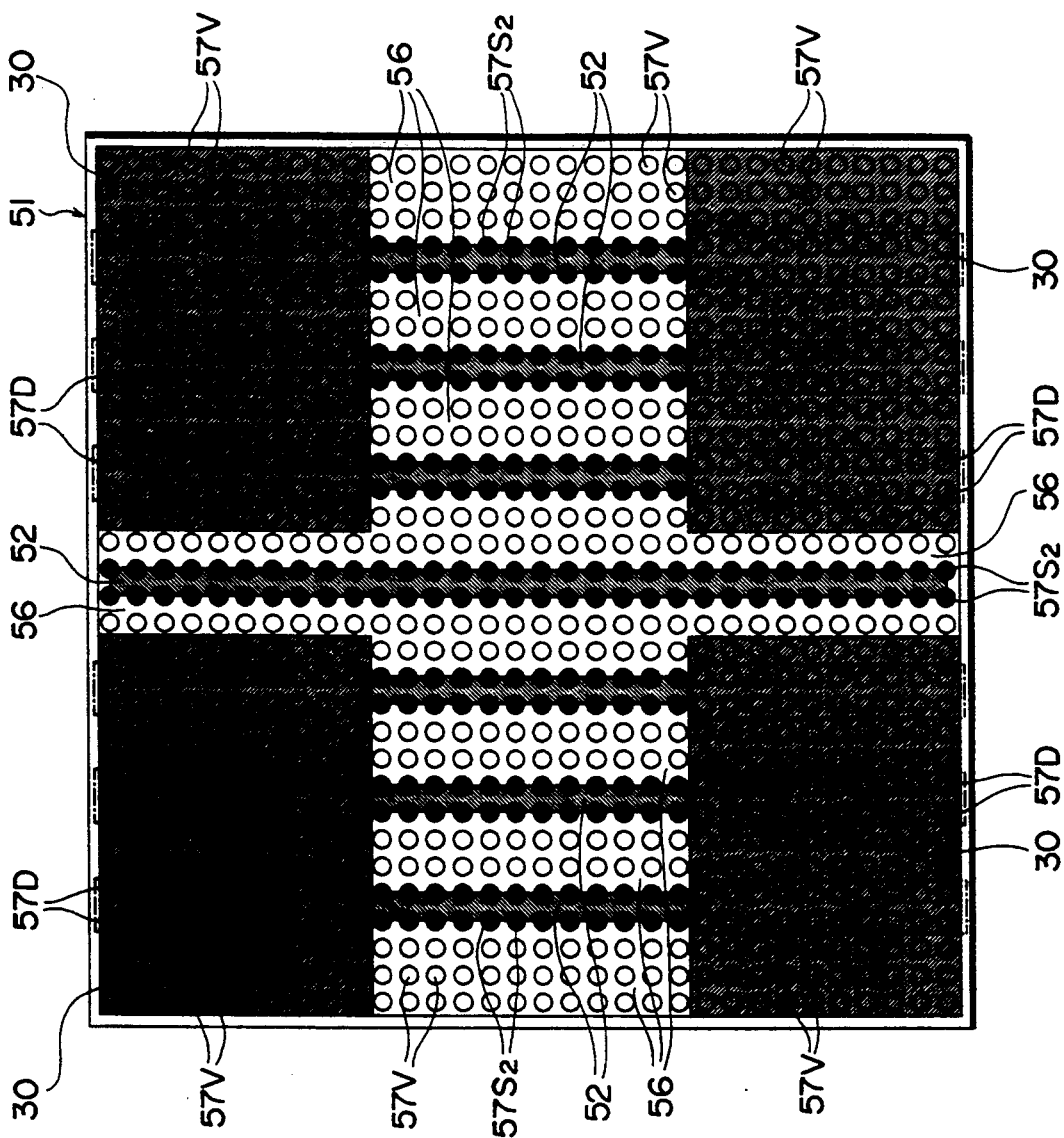

INTEGRATED CIRCUIT HAVING ALTERNATE ROWS OF LOGIC CELLS AND I/O CELLS

BACKGROUND OF THE INVENTION

The present invention relates to a semiconductor integrated circuit device. More specifically, the invention relates to a technology particularly effective in application for ASIC (Application Specific Integrated Circuit or Application Specific Standard Product) device.

Designing theory of ASIC device covers all of semiconductor integrated circuit devices employing any of standard cell type, gate array type, custom type and so forth. ASIC devices are generally designed and developed in the aid of a design automation system (DA: Design Automation) typically using a computer. For example, in the case of the semiconductor integrated circuit device employing the standard cell system, it is typical process to store a plurality of macro-cells (functional circuit blocks) which are preliminarily designed with optimal designs, to arrange some macro-cells depending upon necessity, and to mutually connect these macro-cells. Accordingly, the semiconductor integrated circuit devices employing the standard cell system is featured in short turn around time and relatively high density and circuit performance, and thus is suitable for production in wide variety and small production amount.

The ASIC device is generally formed with a rectangular monocrystalline silicon substrate. In the central area on the main surface of the monocrystalline silicon substrate (semiconductor substrate), an internal logic circuit including a plurality of and a plural kinds of macro-cells is formed. On the peripheral portion of the internal logic circuit formed on the main surface of the monocrystalline silicon substrate, an input/output circuit including either of or both of an input circuit and an output circuit is formed. On the peripheral portion of the input/output circuit on the main surface of the substrate, a plurality of external terminals (bonding pads) are further arranged.

One or more ASIC devices, each of which is to be assembled in a large scale computer and thus required high arithmetic processing speed and high density, are mounted on a mounting board, such as mother board, testing board or so forth, utilizing face-down bonding. In the face-down bonding, soldering bump electrodes are interposed between external terminals of the ASIC device and terminals of the mounting board for mechanically and electrically connecting therebetween.

In the face-down bonding signal propagation paths and power supply paths between the external terminals of the ASIC device and the terminals of the mounting board are shorter than in the wire bonding. Namely, shortening of the signal propagation paths is expected to achieve higher signal propagation speed and thus to contribute to a higher speed circuit operation. On the other hand, shortening of the power supply paths is expected to achieve suppression of power source noise and to contribute to stability of the circuit operation. Therefore, improvement of the circuit operation speed of the ASIC device can be expected.

Also, the face-down bonding permits reduction of an occupation area and a high density since, when a plurality of ASIC devices are mounted on a single mounting board, a part of an encapsulating material for the ASIC device can be used in common by a plurality of the ASIC devices (known as a multi-chip module).

Furthermore, the face-down bonding permits forced cooling from the reverse side (other main surface of the monocrystalline silicon substrate, where no circuit is mounted). Namely, in the case of the ASIC device causing large heat generation, such as the ASIC device, in which the internal logic circuit is constituted principally with bipolar transistors, reliability of the circuit operation will certainly be assured.

JP-A-62-194640 (laid-open on Aug. 27, 1987) shows a semiconductor integrated circuit device employing bump-mounting technique, in which a number of bumps are arranged to be distributed all over the surface of a semiconductor chip, I/O gate cells in a gate array are arranged along the periphery of the chip and in boundary areas on the chip surface which divide the chip surface into regions, and internal gates are arranged in the regions.

SUMMARY OF THE INVENTION

However, in advance of development of above-mentioned ASIC devices, the inventors have made technical investigations and have found the following facts.

(1) An ASIC device is fabricated by arranging an input/output circuit (hereafter referred to as "I/O circuit") and external terminals in order so that the latter surrounds the internal logic circuit. Therefore, the connection length (signal propagation path length) between the external terminals and the internal logic circuit via the I/O circuit is long. Also, due to connection and by-pass in the internal logic circuit, the connection length is further increased. Therefore, the signal propagation speed is lowered to cause a lowering of the speed of the circuit operation of the ASIC device.

(2) The area of the I/O circuit of the ASIC device is used as a area for a power supply conductors, but is not used as an connection channel for connection between the macro-cells and between the internal logic circuits in the macro-cells. Therefore, the area of the I/O circuit cannot be used effectively (wasting areas which are left unused may exist). Furthermore, it sometimes causes lack of the connections for the internal logic circuit to lower the use efficiency of the logic circuit cell of the internal logic circuit and thus to cause lowering of density of the ASIC device.

(3) In the ASIC device, a clock amplifying circuit for supplying a clock pulse signal for controlling circuit operation of the macro-cells (or logic circuits) is included in the internal logic circuit. Connection channels each including a plurality of connection conductors are arranged around the clock amplifying circuit to make use of the logic circuit cells around the clock amplifying circuit which are not available for use. If the clock amplifying circuit is provided in the internal logic circuit, the regularity of the arrangement of the logic circuit cells of the internal logic circuit is disturbed to make arrangement of the conductor pattern for forming the macro-cells and connections difficult. This results in lowering of the use efficiency of the logic circuit of the internal logic circuit to lower the density of the ASIC device.

(4) The ASIC device as set forth above is mounted on a mounting board in face-down bonding with solder bump electrodes interposed therebetween. The solder bump electrode is formed to be larger in cross-section at the portion forming the signal propagation path in comparison with the plan size of the external terminal for the purpose of prevention of damage due to stress (i.e. shearing) caused by the heat generated during circuit operation of the ASIC device and of certainly maintaining reliability of connection. Therefore, the size and arrangement pitch of the I/O circuits are restricted by the size and arrangement pitch of the solder bump electrodes to make the size of the I/O circuit larger to cause lowering of the density of the ASIC device.

Conversely, when the size of the I/O circuit is increased, number of the I/O circuits to be arranged is decreased to border increasing of terminals (multiplication of pins).

Therefore, it is an object of the present invention to provide a semiconductor integrated circuit device which can achieve a higher operation speed and improvement of a higher density.

Another object of the invention is to provide a semiconductor integrated circuit device which permits increasing the number of I/O circuits (multiplication of terminals).

A further object of the present invention is to provide a semiconductor integrated circuit device which can improve reliability in operation.

According to one aspect of the present invention, a semiconductor IC device includes an input/output circuit and an internal logic circuit connected with the input/output circuit both formed in a main surface of a semiconductor substrate of a generally rectangular shape having a predetermined thickness, in which:

the internal logic circuit is divided into at least three logic circuit blocks such that edges of the logic circuit blocks defined by the division on the main surface of the substrate extend in a first direction substantially parallel with a pair of opposite sides of said substrate;

the input/output circuit is divided into at least two input/output circuit blocks such that edges of the logic circuit blocks defined by the division on the main surface of the substrate extend in the first direction; and each of the input/output circuit blocks is sandwiched by and electrically connected with adjacently arranged two of the logic circuit blocks.

According to another aspect of the present invention, a semiconductor IC circuit device includes a semiconductor substrate of a generally rectangular shape having a predetermined thickness and having a main surface, an internal logic circuit having a plurality of logic circuit blocks formed in the main surface of the semiconductor substrate, an input/output circuit having a plurality of input/output circuit blocks formed in the main surface of said semiconductor substrate, and a pattern of conductors for interconnecting the logic circuit blocks and the input/output circuit blocks, in which:

each of the logic circuit blocks includes a plurality of rows of logic cells, each row extending in a first direction substantially parallel with a first pair of opposite sides of the rectangular semiconductor substrate;

each of the input/output circuit blocks includes a plurality of rows of input/output circuit cells, each row extending in the first direction; and the logic circuit blocks and the input/output circuit blocks are juxtaposed alternately in a second direction substantially perpendicular to the first direction in the main surface of the semiconductor substrate such that each of the input/output circuit blocks is sandwiched by two adjacently juxtaposed logic circuit blocks.

BRIEF DESCRIPTION OF THE DRAWINGS

FIG. 20 is a plan view showing arrangement of the solder bump electrodes of the ASIC device shown in FIG. 17.

DESCRIPTION OF THE PREFERRED EMBODIMENTS

Embodiment 1

In a first embodiment, the present invention is applied to an ASIC device having an internal logic circuit mainly constituted by bipolar transistors.

Figure 1:
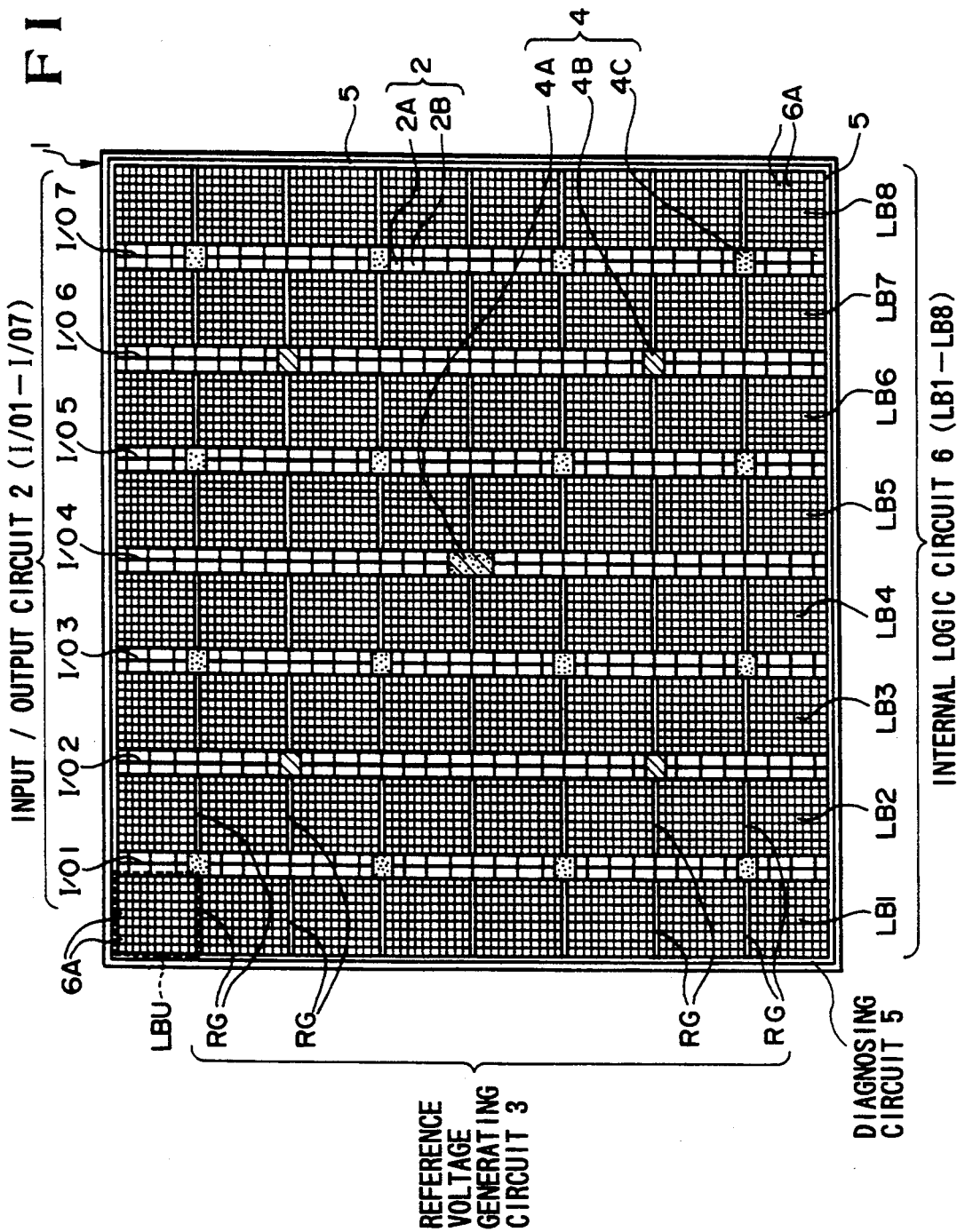
FIG. 1 is a layout diagram of a chip of an ASIC device according to an embodiment of the present invention.

This embodiment of an ASIC device (semiconductor integrated circuit device) according to the present invention is illustrated in FIG. 1 (chip layout diagram).

As shown in FIG. 1, the embodiment of the ASIC device 1 is formed into a generally rectangular (square in the shovel first embodiment) shaped configuration, and includes a monocrystalline substrate of silicon, for example. The ASIC device 1 has an input/output circuit 2 and an internal logic circuit 6 in approximately overall area of the main surface of the monocrystalline silicon substrate, except for the peripheral portion. The ASIC device 1 may additionally have a diagnosing circuit in the area (areas extending along respective outermost edges of rectangular configuration of the monocrystalline silicon substrate) surrounding the input/output circuit 2 and the internal logic circuit 6.

Figure 2:
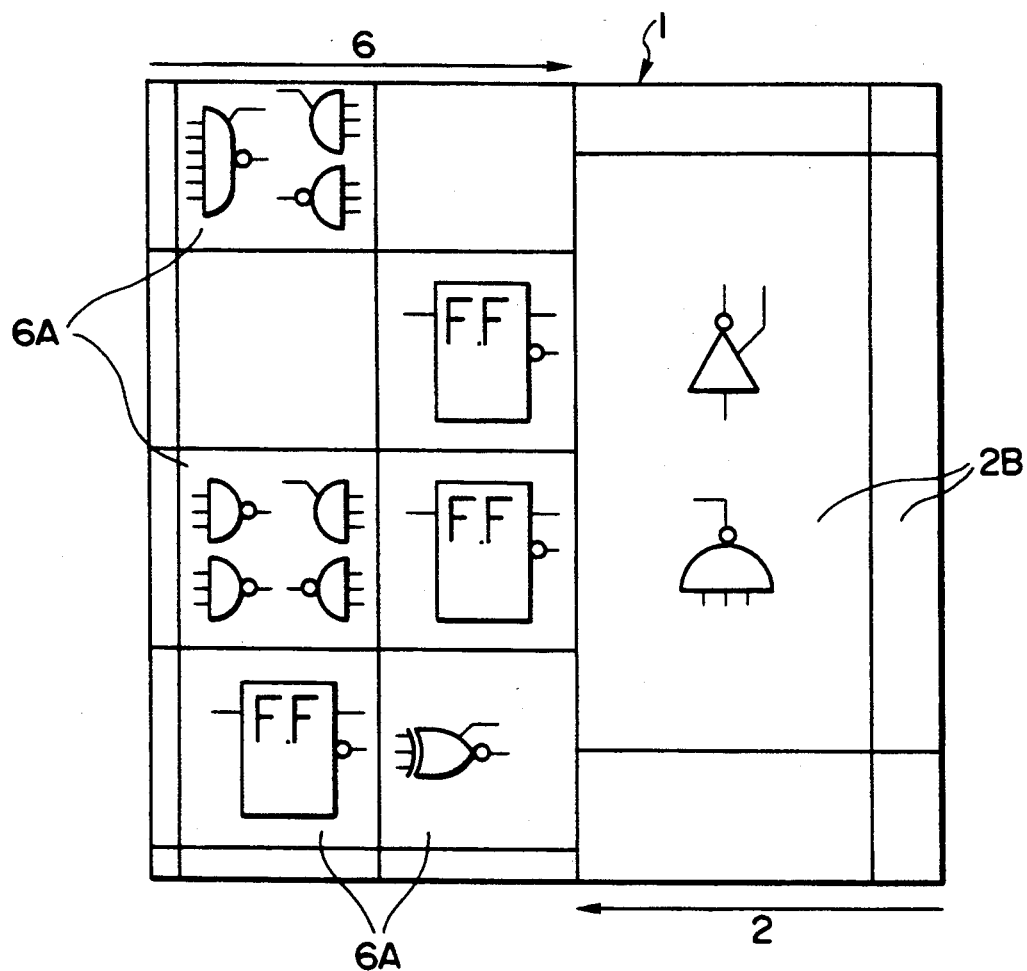
FIG. 2 is an illustration in block form of a circuit to be included in an ASIC device chip shown in FIG. 1.

In general, the internal logic circuit 6 includes a plurality of logic circuit cells (raw cells) 6A regularly (namely in row and column) layout in either in lateral or horizontal and vertical directions in FIG. 1. The logic circuit cell 6A may be formed by a macrocell (functional circuit block) having a logical function (or storage function) or by connection to include the logic circuit forming a part of such macro-cell. A plurality of logic circuit cell may have identical logic circuits. A logic circuit cell 6A may includes, for example, a logic circuit (a macro-cell or a part of the macro-cell), such as a flip-flop circuit (F.F.), NAND gate circuit, NOR gate circuit or NOT gate circuit, as shown in FIG. 2 (a block diagram showing some circuits included in the ASIC device 1).

Arrangement of the connection pattern for determining the circuit structure of the logic circuit cells 6A are performed in almost fully automated manner by a computer-aided design automation (DA) system. The development of an ASIC device 1 is performed through generally separated three stages of a designing stage for circuit system to be performed by the design automation system (layout of the circuits and the connections), a mask preparation stage for preparing a mask on the basis of the layout information formed by the design automation system, and a production stage for actually producing ASIC devices 1 through a semiconductor production process employing the mask thus prepared. Namely, determination of the layout of the connection pattern to determine the structure of the logic circuit for the logic circuit cells 6A is performed at relatively earlier stage of the development of the ASIC device 1.

Figure 3:
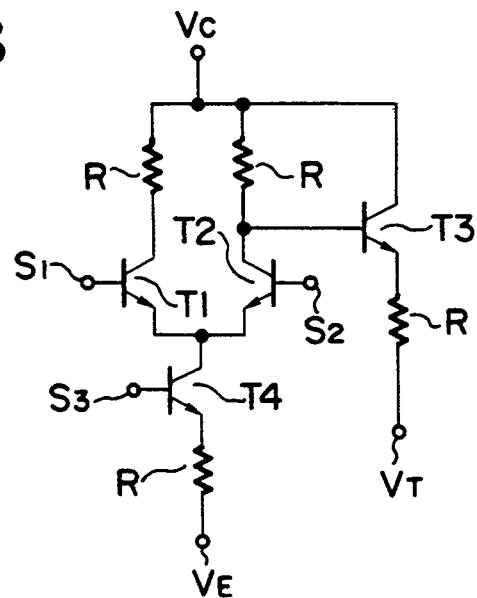
FIG. 3 is a circuit diagram showing one example of a logic circuit cell to be included in the ASIC device cell of FIG. 1.

Although the practical layout and number of the semiconductor elements are not illustrated, the logic circuit cell 6A may comprise bipolar transistors T as primary components, which will easily make an ECL (Emitter Coupled Logic), as shown in FIG. 3 (a circuit diagram of one example of a circuit included in the logic circuit cell) The bipolar transistor T has an NPN type vertical structure which holds good high speed circuit operation performance. In the first embodiment, the logic circuit cell 6A includes four vertical structure NPN type bipolar transistors T1 to T4. The logic cell 6A also includes a plurality of resistor elements (diffusion resistor element or polycrystalline silicon resistor elements) in addition to the bipolar transistors.

In FIG. 1, the internal logic circuit 6 is divided into a plurality of logic circuit blocks LB1–LB8, e.g. eight (at least three or even number of at least four) blocks in the first embodiment) in the lateral direction. Division of the internal logic circuit 6 into the logic circuit blocks LB1–LB8 is performed in such a manner that edges of the logic circuit blocks defined by the division on the main surface of the substrate extend substantially in parallel to a pair of sides of the substrate (in a first direction). In spaces defined between the logic circuit blocks LB1–LB8, input/output circuit blocks I/O1–I/O7 are arranged. The input/output circuit blocks I/O1–I/O7 form the input/output circuit 2.

On the other hand, each of the logic circuit blocks LB1–LB8 is separated into a plurality of logic circuit cell units LBU, eight in the first embodiment, in the vertical direction of FIG. 1. Each logic circuit cell unit (hereafter simply referred to as "cell unit") includes a plurality of logic circuit cells. Division of each of the logic circuit blocks LB1–LB8 into the logic circuit cell units is performed in such a manner that the edges of the logic circuit cell units defined by the division on the main surface of the substrate extend substantially in parallel to the other pair of sides of the substrate (in a second direction). In spaces between the cell units LBU, reference voltage generators RG are arranged. These reference voltage generators RG form a reference voltage generating circuit 3.

Namely, each of a plurality of the cell units LBU (corresponding areas indicated by the broken lines) except for the cell units arranged in the peripheral area of the ASIC device 1, is arranged in the area surrounded by two adjacently arranged input/output circuit blocks I/O and two adjacently arranged reference voltage generators RG. In other words, two cell units adjacent in the second direction among the divided plurality of cell units, are disposed on left and right hand sides of the input/output circuit block I/O, and two cell units adjacent in the first direction among the divided plurality of cell units are disposed on upper and lower sides of the reference voltage generator RG as viewed on the drawing.

A plurality of cell units LBU forming the internal logic circuit 6 are arranged without connection channel areas for connection conductors interposed therebetween, in overall area of the central portion of one main surface of the monocrystalline silicon substrate 10 except for the area of the input/output circuit 2 and the reference voltage generating circuit 3. Therefore, the shown embodiment of the ASIC device 1 is formed in sea of gates system. In this sea of gates system, predetermined connections are effected for logic cells 6A arranged in the predetermined areas of the internal logic circuit 6 for forming logic gates of a LSI device, and those areas of logic circuit cells 6A which are not used for forming the logic gates of the LSI device are used as connection channel areas.

The input/output circuit blocks I/O1–I/O7 of the input/output circuit 2 are formed by a plurality of input/output circuit cells (raw cells) 2A and 2B regularly arranged both in the vertical and lateral directions of FIG. 1. These input/output circuit cells 2A and 2B are used as an interface circuit with the circuits (e.g., macro-cells) arranged in the internal logic circuit 6 of the ASIC device 1, and performs level conversion for each of input signals to the LSI device formed by the ASIC device 1 and output signals therefrom.

Figure 4:
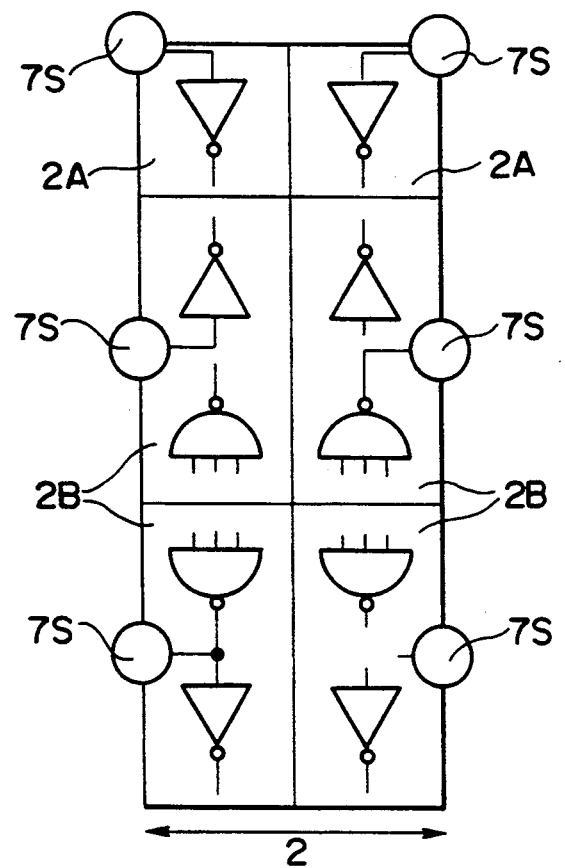
FIG. 4 is an illustration showing a circuit included in an I/O circuit cell included in the ASIC device chip of FIG. 1.

Connections are effected for the input/output circuit cells 2A and 2B so as to include one or more of a NOT gate circuit, an AND gate circuit and so forth, as shown in FIGS. 2 and 4 (block diagram of the major portion of the input/output circuit). A plurality of input/output circuit cells may include identical circuits. Among the input/output circuits 2, the input/output circuit cells 2A include a circuit specified for receiving an input signal (or for delivering an output signal), such as NOT gate circuit. The input/output circuit cells 2B include one of a circuit specified for receiving an input signal, a circuit specified for delivering an output signal and a circuit specified for both receiving an input signal and delivering an output signal. The input/output circuit cell 2B is used as an input buffer circuit when connection is established to include a NOT gate, and as an output buffer circuit when connection is established to use an AND gate, for example. On the other hand, the input/output circuit cell 2B is used as an input/output buffer circuit if connection is established to include a NOT gate circuit and an AND gate circuit.

The arrangement of the connection pattern for determining the circuit structure of the input/output circuit cells 2A and 2B of the input/output circuit 2 is performed substantially in fully automated manner by the computer-aided DA system similarly to the logic circuit cell 6A of the internal logic circuit 6. The areas for the input/output circuit cells 2A and 2B of the input/output circuit 2 where input buffer circuits are included are formed by bipolar transistors when the ASIC device 1 is a semiconductor integrated circuit formed primarily with bipolar transistors (pure bipolar LSI), and are formed with complementary MISFETs useful for size reduction when the ASIC device 1 is a semiconductor integrated circuit device (Bi-COMS LSI) which has both of bipolar transistors and complementary MISFETs on a common monocrystalline silicon substrate (a Bi-CMOS LSI device). The areas of the output buffer circuit of the input/output circuit cells 2B are primarily formed by the bipolar transistor having high driving performance for the next stage circuit.

The input/output circuit 2 is divided into a plurality of input/output circuit blocks I/O1–I/O7 in the same lateral direction in FIG. 1, in which the internal logic circuit 6 is divided into a plurality of the logic circuit blocks LB1–LB8 (at least two or an odd nun%bet of at least three). Each of a plurality of the input/output circuit blocks are arranged between the logic circuit blocks LB1–LB8. Namely, the logic circuit blocks LB1–LB8 are arranged at both sides of the input/output circuit blocks I/O1–I/O7.

Each of the input/output circuit blocks I/O1–I/O7 is arranged in such a manner that two input/output circuit cells 2A or two input/output cells 2B are arranged in the second direction (lateral direction as viewed on the drawing, for example) and a plurality of (two or more) cells including both of the input/output circuit cells 2A and 2B are arranged in the first direction (vertical direction as viewed on the drawing, for example). Namely, each of the plurality of input/output circuit blocks are foraged by two rows of the input/output circuit cells juxtaposed in the second direction, in which a plurality of the input/output circuit cells 2A and 2B are aligned in the first direction in each row. Although the vertical to lateral ratio of the arrangement for the input/output circuit block is not limited to the shown ratio, in the first embodiment, a smaller number of the input/output circuit cells 2A are aligned in the first direction than the number of input/output circuit cells 2B arranged in the first direction. As will be set forth later, each input/output circuit cell 2B is formed in a planar rectangular configuration having a side length in the first direction of a side length in the second direction. Namely, each of the plurality of the input/output circuit blocks is arranged in such a layout that the input/output circuit block extends from one side to the opposite side of the rectangular configuration monocrystalline silicon substrate of the ASIC device 1 (in other words, in the area surrounded by the diagnosing circuit 5).

As a result, each of the plurality of input/output circuit blocks I/O1–I/O7 are formed to have elongated rectangular planar configuration shorter in the second direction and longer in the first direction. Since the input/output circuit blocks are arranged with the logic circuit blocks LB1–LB8 interposed therebetween in the second direction, the overall input/output circuit 2 forths a strip form layout.

In the input/output circuit 2, each input/output circuit block has a length in the first direction substantially identical with the length of one side of the rectangular monocrystalline silicon substrate, and has at least two rows of input/output circuit cells juxtaposed in the second direction (four or more rows of the input/output circuit cells). Namely, the input/output circuit 2 may include a greater number of input/output circuit cells 2A and 2B in comparison with the same where the input/output circuit is arranged along respective of four sides around the internal logic circuit 6 (i.e., along the four chip sides). In other words, the input/output circuit 2 possesses a length derived by multiplying the length of the input/output circuit cell in the first direction with the number of all of the input/output circuit cells 2B (derived by multiplying the length of the input/output circuit block in the first direction with the total number of overall input/output circuit cell rows). The total length of the input/output circuit 2 is longer than the peripheral length of the chip. Thus, the ASIC device 1 may have a correspondingly increased number of input/output circuit cells for the input/output circuit 2.

By alternately arranging the logic circuit blocks LB and the input/output circuit blocks I/O in the second direction for a specific arrangement of the logic circuit cells 6A of the internal logic circuit 6 and the input/output circuit cells 2A and 2B of the input/output circuit 2 on the main surface of the chip in which the lengthwise directions of the logic circuit blocks and the input/output circuit blocks are the first direction, the connection length extending within the area of a plurality of the logic circuit blocks LB can be shortened to the extent corresponding to the number of the logic circuit blocks into which the logic circuit is divided. On the other hand, with the relative arrangement of the internal logic circuit 6 and the input/output circuit 2, the connection length for connecting logic circuits for, for example, predetermined logic circuit cells 6A in the logic circuit blocks LB and the input/output circuit block I/O can be shortened. Similar effect can be obtained with respect to the division of the logic circuit blocks LB into a plurality of the logic circuit cell units LBU and arrangement of a plurality of the reference voltage generators in the vertical direction (first direction).

Similar to the logic circuit cell 6A of the internal logic circuit 6 and the input/output circuit cells 2A and 2B of the input/output circuit 2, the reference voltage generating circuit 3 are divided into a plurality of the reference voltage generators RG in the first and second directions. The reference voltage generators RG generate a reference voltage to be mainly used by the macrocells included in the internal logic circuits, parts thereof, input/output circuit 2 and clock amplifying circuit 4 which will be discussed later. With such arrangement of the reference voltage generators RG, the connection lengths between a plurality of the logic circuit cell units BLU, the input/output blocks LB, and the clock amplifying circuits 6 can be respectively shortened.

Figure 5:
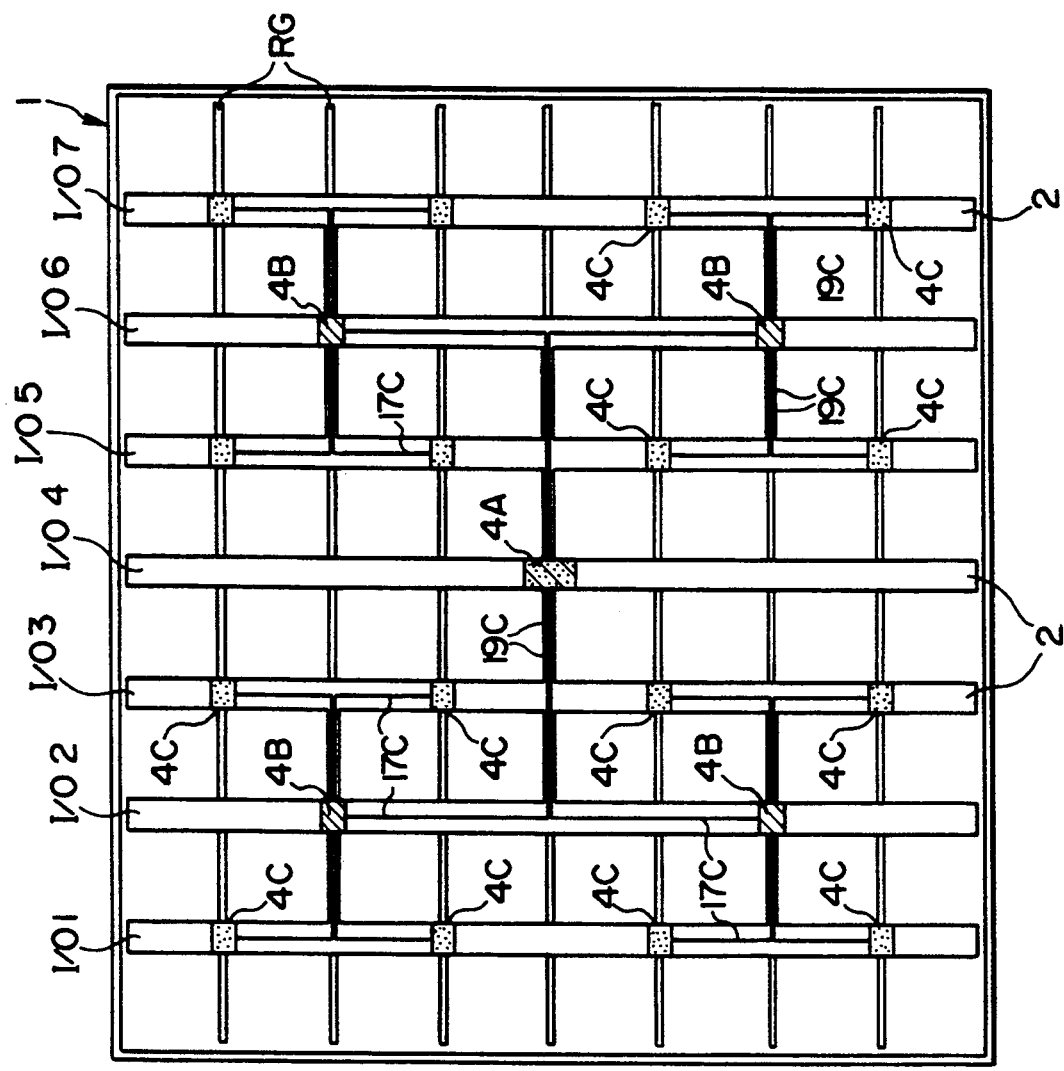
FIG. 5 is an illustration showing arrangement of a clock amplifying circuit to be included in the ASIC device chip of FIG. 1.
Figure 6:
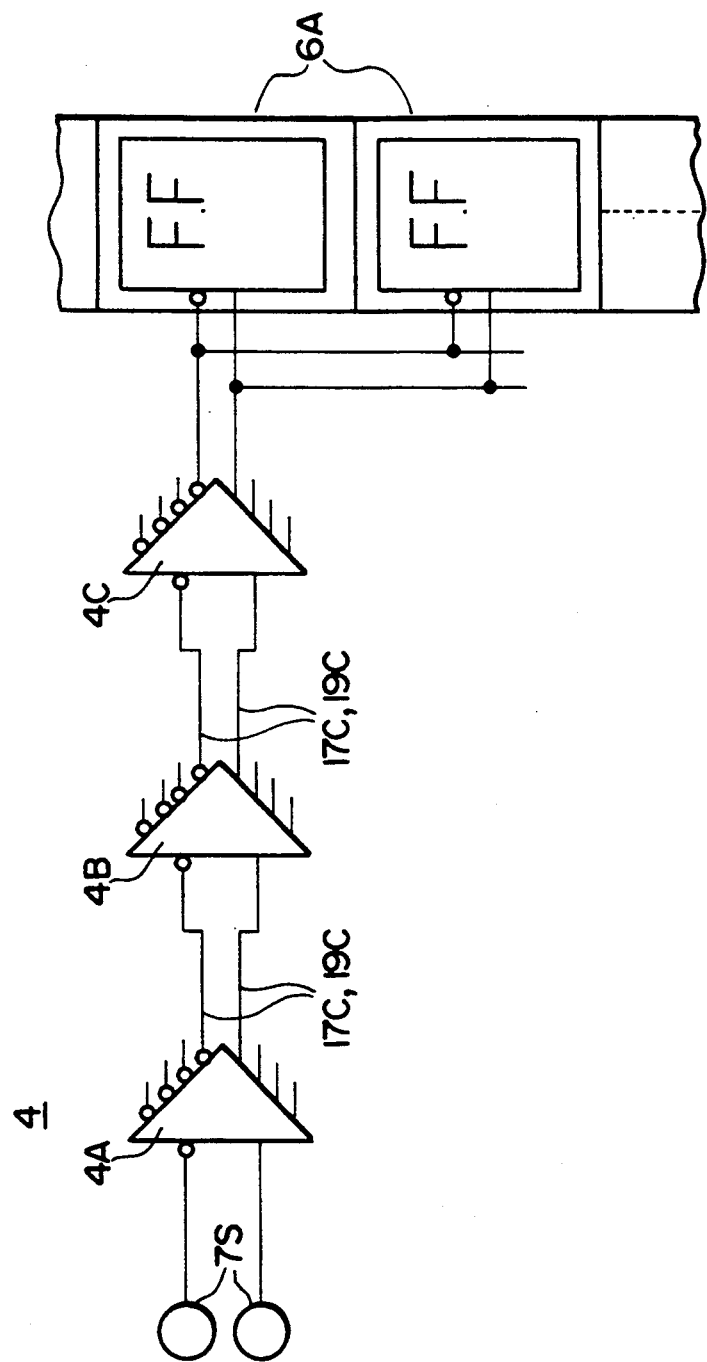
FIG. 6 is a block diagram of a clock amplifying circuit.

As shown in FIGS. 1 and 5 (illustration of a chip layout showing a positional relationship of the clock amplifying circuit), the clock amplifying circuit 4 shown in FIG. 6 (block diagram of the clock amplifying circuit) is provided in the ASIC device 1. The clock amplifying circuit 4 includes a first stage clock amplifier (clock shaper) 4A, an intermediate stage clock amplifier 4B and a final stage clock amplifier, which clock amplifiers are arranged in cascade.

The first stage clock amplifier 4A of the clock amplifying circuit 4 is arranged in some areas for the input/output circuit block 4 (although these areas are adapted for an input/output circuit cells 2A or 2B, the first stage clock amplifier 4A is arranged in place of an input/output circuit cell 2A or 2B) at the central portion of the main surface of the chip of the ASIC device 1. This first stage clock amplifier 4A distributes a clock signal inputted from an external device to the ASIC device 1 to the intermediate stage clock amplifiers 4B.

Four intermediate stage clock amplifiers 4B are respectively arranged at the center of the areas defined by dividing the main surface of the chip of the ASIC device 1. Similar to the first stage clock amplifier 4A, the intermediate clock amplifiers 4B are arranged in areas for the input/output circuit blocks I/O2 and I/O6. The intermediate clock amplifiers 4B further distribute the clock signal distributed by the first clock amplifier 4A to the final clock amplifiers 4C. Each of the first stage clock amplifiers 4A and four intermediate stage clock amplifiers 4B are connected by a uniform length of connections. The arrangement of the connections and interconnection layers to be used and so forth will be discussed later.

Sixteen final stage clock amplifiers 4C are arranged at about the centers of respective areas defined by dividing the main surface of the chip of the ASIC device 1 into sixteen, for example. Similar to the foregoing first clock amplifier 4A, the final stage clock amplifiers 4C are arranged in areas for the input/output circuit blocks I/O1, I/O3, I/O5 and I/O7. These final clock amplifiers 4C supply the clock signal distributed from the intermediate stage clock amplifiers 4B to the macro-cells included in four logic circuit cell units LBU arranged therearound and a part thereof (for example, the flip-flop circuits included in the logic circuit cell 6A as shown in FIG. 6). Since total four intermediate stage clock amplifiers 4B are arranged relative to the total sixteen final clock amplifiers 4C, each of the intermediate clock amplifiers 4B distributes the clock signal for four final clock amplifiers 4C. Each intermediate stage clock amplifier 4B and the associated four final stage clock amplifiers 4C are connected though a uniform length of connections, respectively. The arrangement of the connections and interconnection layers to be used and so forth will be discussed later.

It should be appreciated that the clock amplifying circuit 4 is not limited to the above-mentioned three stage construction and may be of two stage, four stage or more than four stage depending upon number of division of the internal logic circuit or power consumption in the divided logic circuit blocks LB.

Figure 7:
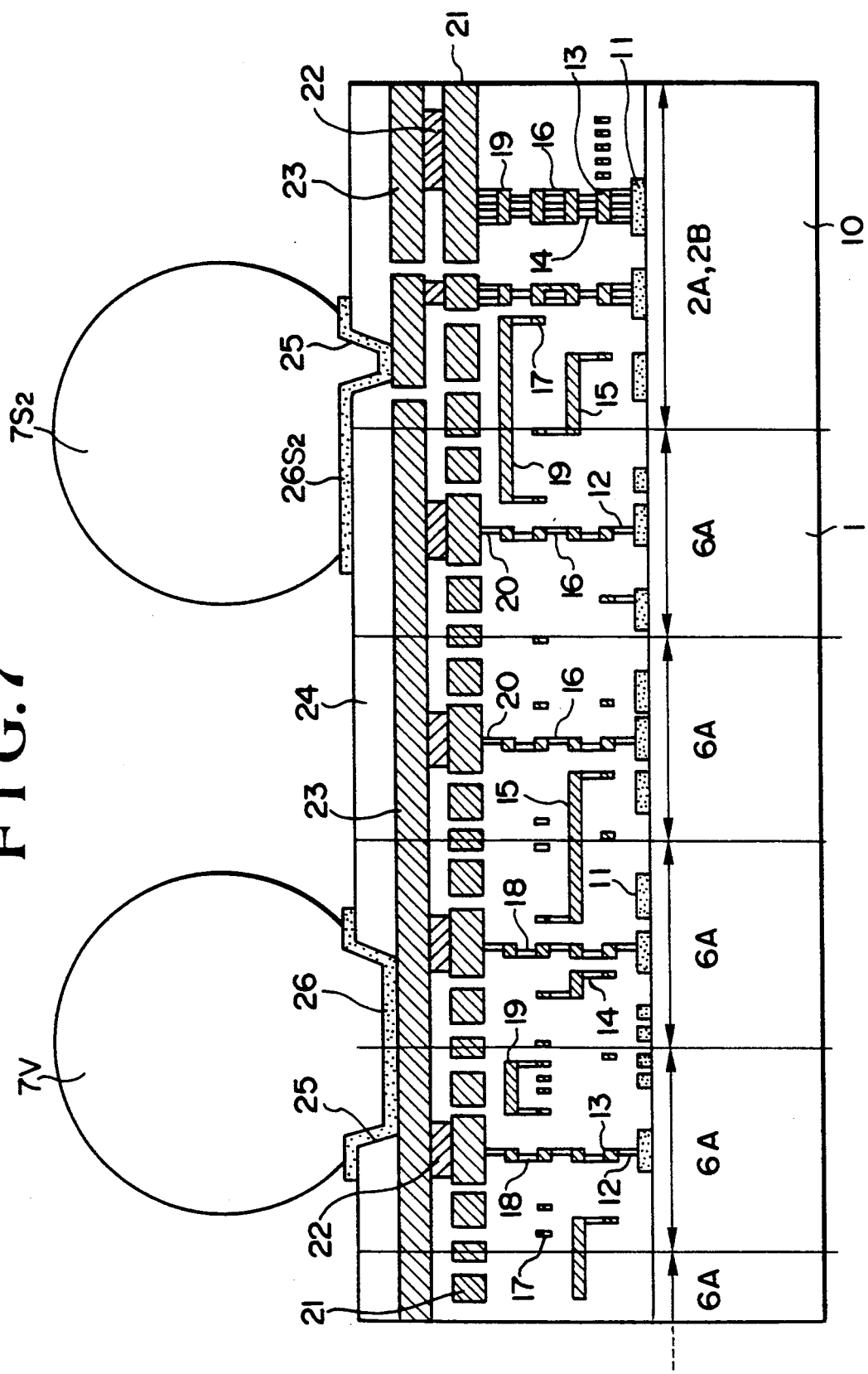
FIG. 7 is a section of the major part of the ASIC device and the major part of the ASIC device including the a multi-level interconnection structure formed thereon.

Next, brief description will be given of the cross-sectional structure of the ASIC device 1, particularly to the interconnection layers with reference to FIG. 7 (cross-section of the major part of the ASIC device 1). In FIG. 7, numerals 2A and 2B denote areas of the input/output circuit cells in the input/output circuit 2 in the ASIC device 1 (substrate 10), 6A denote an area of a logic circuit cell of the internal logic circuit 6 in the ASIC device 1 (substrate 10).

As set forth above, the ASIC device 1 is primarily formed with the monocrystalline silicon substrate 10. When the logic circuit cells 6A of the internal logic circuit 6 and the input/output circuit cells 2A and 2B of the input/output circuit 2 are mainly formed by the bipolar transistors, respectively, use is made of a substrate which is fabricated by growing an n-type epitaxial layer on the surface (element forming surface) of a p-type monocrystalline silicon wafer, for example. This is commonly applicable to the case where the primary components are bipolar transistors and complementary MISFETs. On the other hand, when that the primary components are complementary MISFETs, a monocrystalline silicon substrate without an epitaxial layer may be used.

In one of the main surfaces of the monocrystalline silicon substrate 10, the internal logic circuit 6, the input/output circuit 2, the reference voltage generating circuit 3, the clock amplifying circuit 4 and so forth, including the semiconductor elements, such as the bipolar transistors, are formed in the arrangement set forth above. Over the semiconductor elements, a plurality of, e.g. seven, interconnection layers are laminated on the monocrystalline silicon substrate 10.

With an insulating film (not shown) disposed on the main surface of the semiconductor substrate 10, a first level interconnecting layer 11 is formed thereon. A first level interconnecting layer 11 is electrically connected to respective electrodes of the semiconductor element through a connection holes (contact holes, not shown) formed through the insulating layer so as to connect the semiconductor elements to each other. As shown in FIG. 7 and FIG. 2 (plan view of the major portion of the ASIC device, the first level inter-connection layer 11 is used as a so-called inter-cell connection means for connection between the semiconductor elements included in the logic circuit cells 6A of the internal logic circuit 6 and the semiconductor elements respectively included in the input/output circuit cells 2A and 2B of the input/output circuit 2.

The first level interconnection layer 11 is formed by a W (tungsten) layer deposited by way of a CVD method, sputtering method or both and has a relatively small thickness in the order of approximately 0.4–0.6 μm. Since a W layer has higher electro-migration durability (EMD) and stress-migration durability (SMD) in comparison with an aluminum layer, the layer thickness can be made small. Formation of this first level interconnection layer 11 in the form of a thin film permits formation of a flat surface of an inter-layer insulating layer for the upper interconnection layer. Also, since the W layer can be processed by the anisotropic etching, such as the reactive etching or so forth, it is suitable for fine patterning. Furthermore, the W layer has good step coverage at stepped areas, such as contact holes to satisfactorily prevent disconnection. It should be noted that, in place of the W layer, a high melting point metal layer such as a Mo layer, a Ti layer or the like, a high melting point metal-silicide single layer made of a compound of the high melting point metal and silicon or a composite layer formed by laminating a monocrystalline silicon layer and a high melting point metal-silicon layer may be employed.

Figure 8:
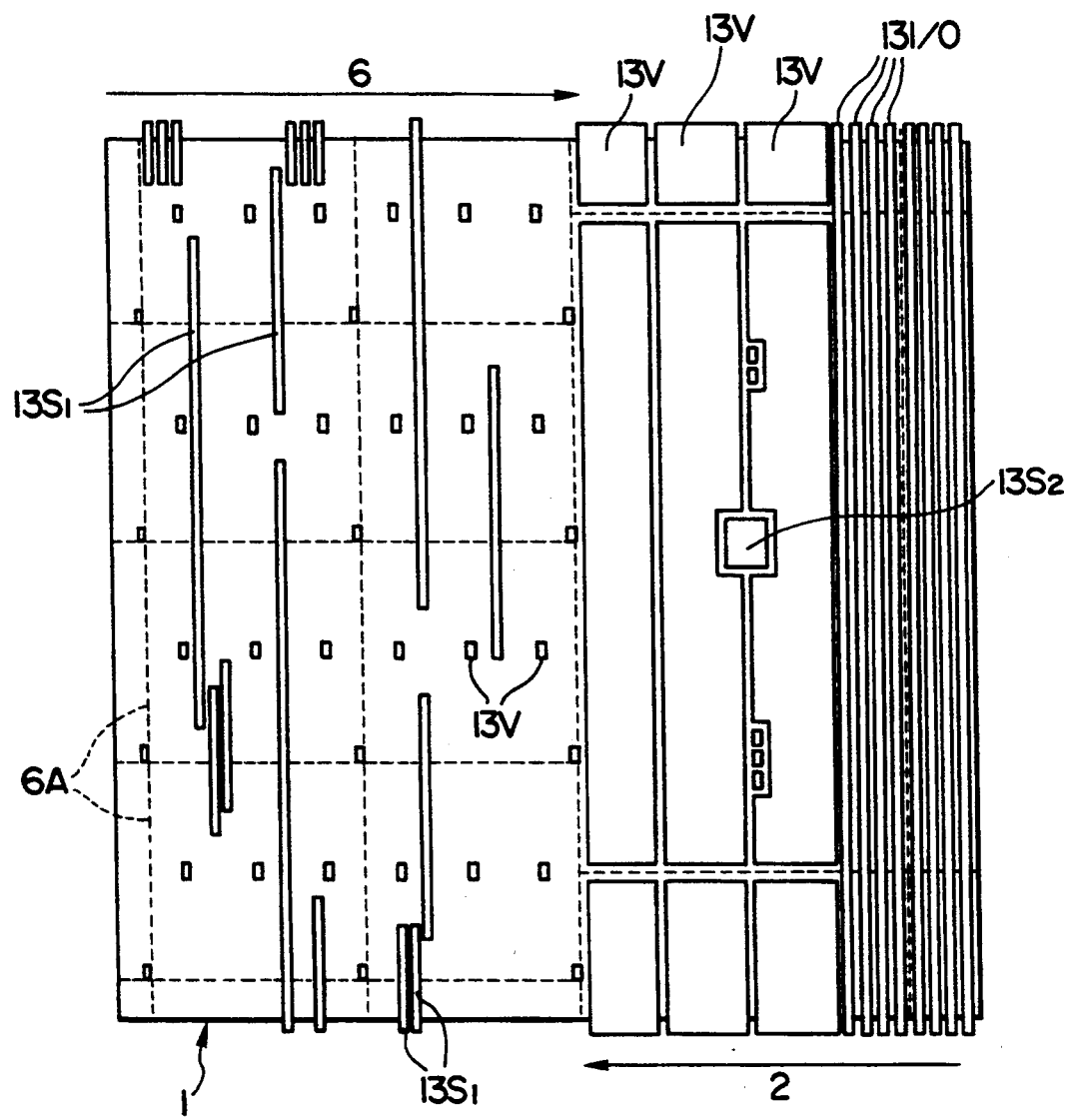
FIGS. 8 to 16 are plan views of the major parts of the multi-layer interconnection structure of the ASIC device shown in FIG. 7.

A second level interconnection layer 13 is arranged on the first level interconnection layer with an inter-layer insulating layer disposed therebetween. The second level interconnection layer 13 effects desired electrical connection in the first level interconnection layer through the connection holes (through holes). As shown in FIG. 7 and FIG. 8 (plan view of the major part of the ASIC device 1), in the second level interconnection layer 13, internal signal conductors $13S_1$ connect the macro-cells arranged in relatively close proximity to each other among the macro-cells (or a part thereof) included in one or more logic circuit cells 6A of the internal logic circuit 6. The internal signal conductors $13S_1$ extend in the first direction to be used as connection specified for connection in the vertical direction, in the internal logic circuit 6.

In the second level interconnection layer 13, power supply conductors 13V, I/O circuit control signal conductors 13I/O and I/O signal conductors $13S_2$ are respectively arranged in the area above the input/output circuit 2.

Three power supply conductors 13V are arranged on areas above the input/output circuit cells 2A and 2B (it may be occasionally referred to simply as "area"). In FIG. 3, the power supply conductors 13V receive lower voltage power (E), power for an emitter-follower (T) and grounding power (C), respectively in order of left to right in FIG. 8. These power supply conductors 13V extend in the vertical direction (first direction) similar to the internal signal conductors $13S_1$ extending in areas above the internal logic circuit 6.

A plurality of the I/O circuit control signal conductors 13I/O are arranged over the boundary between two adjacent rows of the input/output circuit cells of each of a plurality of input/output circuit blocks and extend in the same vertical direction as the power supply conductors 13V. These I/O circuit control signal conductors 13I/O include a pair of I/O circuit control signal conductors for controlling the two rows of the input/output circuit cells of the input/output circuit blocks in common. Namely, the pair of the I/O circuit control signal conductors 13I/O are arranged at the boundary area of two rows of the input/output circuit cells of each of a plurality of the input/output circuit blocks to control the circuit operations of the two rows of the input/output circuit cells.

The pair of I/O circuit control signal conductors 13I/O can be connected to either of input/output circuit cells 2A or 2B of these two rows of the input/output circuit cells in a minimum distance. Also, the I/O circuit control signal conductors 13I/O are provided in pair relative to two rows of the input/output circuit cells. Therefore, the occupied area by the input/output circuit 2 can be reduced by an area corresponding to an area to be occupied for arranging a pair of the second level I/O circuit control signal conductors 13I/O.

The input/output signal conductors $13S_2$ are arranged above the input/output circuit cells 2A or 2B of the input/output circuit 2 for establishing connection between the input/output circuit cells 2A or 2B (an input buffer circuit, an output buffer circuit or an input-/output buffer circuit included therein) and external terminals $26S_2$ (see FIG. 7).

The second level interconnection layer 13 is formed by a laminated layer, in which an Al (aluminum) alloy layer is laminated over a TiW layer, for example, and has a medium thickness of the order of approximately 1.0 μm.

The lower TiW layer is formed primarily for the purpose of increasing of EMD and SMD of the upper Al alloy layer, and may be replaced by a high melting point metal layer or a high melting point metal compound layer such as TiN layer, W layer or the like.

The upper Al alloy layer forms the body of connection and has a lower resistance than the above-mentioned W layer to achieve higher signal propagation speed. The upper Al alloy layer is added with at least one of Cu for increasing EMD and Si for suppressing alloy spike phenomenon. It should be noted that the Al alloy layer may be replaced with an Al layer.

The second level interconnection layer 13 is electrically connected to the lower first level inter-connection layer 11 through an intermediate conductive layer 12 buried in the connection holes formed through the inter-layer insulating layer. The intermediate conductive layer 12 is formed by a W layer deposited above the first level interconnection layer to be exposed at the connection hole, by way of the CVD method, for example. The intermediate conductive layer 12 can provides good step coverage for the second level interconnection layer 13 at the stepped areas of the connection holes or so forth. Thus, it eliminates possibility of disconnection of the second level interconnection layer 13.

Figure 9:
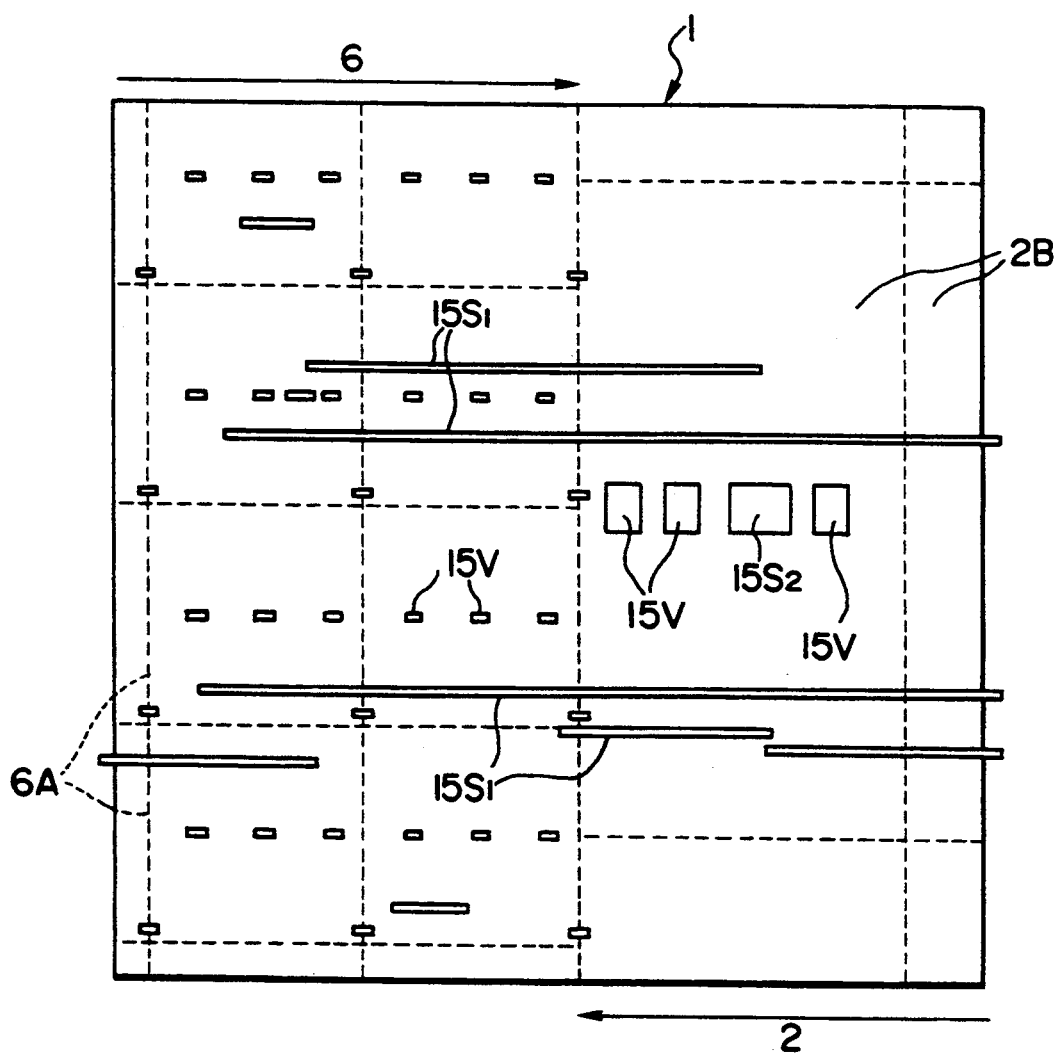

Above the second level interconnection layer 13, a third level interconnection layer 15 is formed via the inter-layer insulating layer. The third level interconnection layer 15 effects desired electrical connection in the second level interconnection layer 13 through the connection holes (through holes) formed through the inter-layer insulating layer. As shown in FIG. 7 and FIG. 9 (plan view of the major part of the ASIC device 1), in the third level interconnection layer 15, signal conductors $15S_1$ extending above the internal logic circuit 6 and the input/output circuit 2 establishes connection between the macro-cells arranged in the relatively proximity to each other and are used as the specified signal line for the lateral direction as extending in the lateral direction (second direction).

These signal conductors $15S_1$ can connect between the macro-cells respectively arranged in the internal logic circuits which are arranged at left and right sides of the input/output circuit blocks, across the area of the input/output circuit blocks of the input/output circuit 2. Namely, the area above the input/output circuit 2 is used as the connection channel area, and in this connection channel area, the signal conductors $15S_1$ are arranged.

On the other hand, in the area of the input/output circuit 2, input/output signal conductors $15S_2$ are arranged for connection between the buffer circuit included in either of the input/output circuit cells 2A and 2B of the input/output circuit 2 and the external terminal $26S_2$ (see FIG. 7).

The third level interconnection layer 15 is formed by a laminated layer, in which an Al alloy layer is laminated over a TiW layer, for example, and has a medium thickness of the order of approximately 1.0 μm, similar to the second level interconnection layer 13. Also, similar to the second level interconnection layer 13, the third level interconnection layer 15 is electrically connected to the lower second level interconnection layer 13 through the intermediate conductive layers 14 formed in the connection holes formed through the inter-layer insulating layer.

Figure 10:
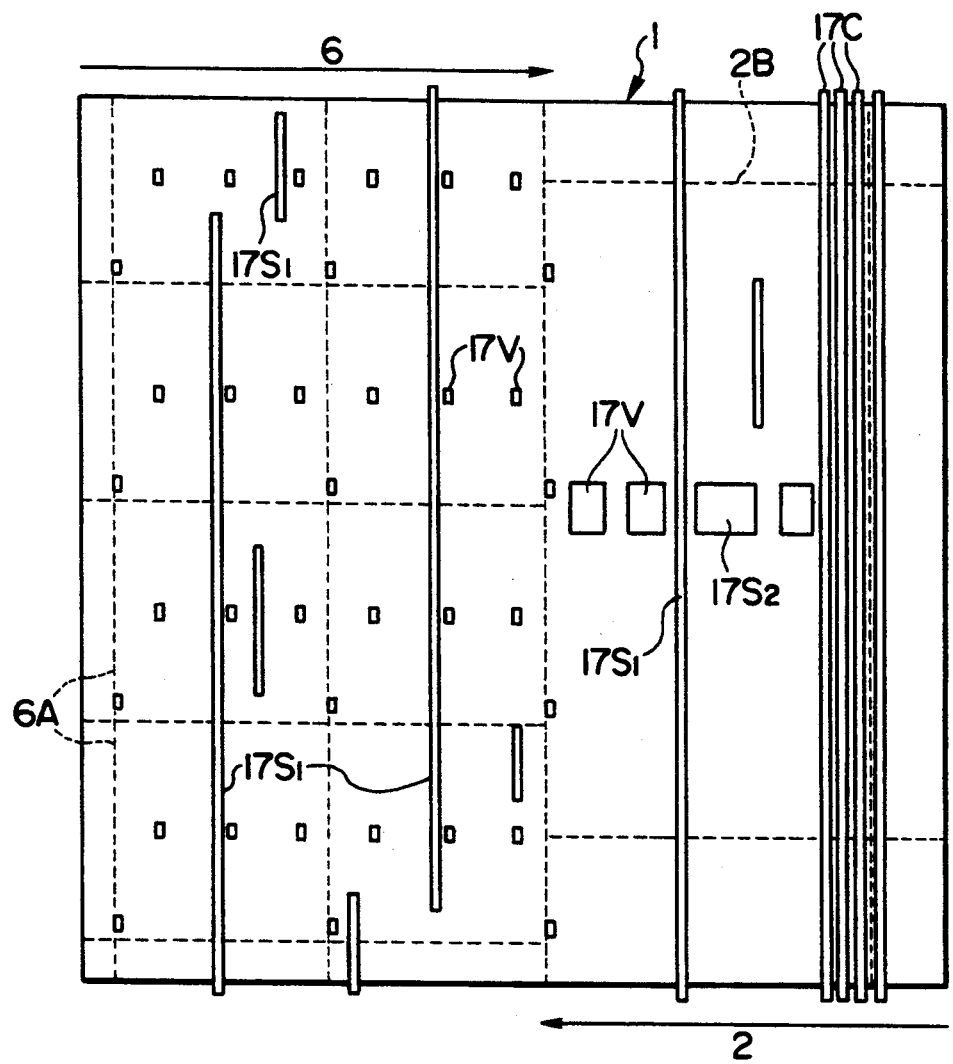

Above the third level interconnection layer, a fourth level interconnection layer 17 is arranged via an inter-layer insulating layer. The fourth level inter-connection layer 17 is electrically connected to the third level interconnection layer 15 through the connection holes (through holes) formed through the inter-layer insulating layer. As shown in FIG. 7 and FIG. 10 (plan view of the major part of the ASIC device 1), in the fourth level interconnection layers 17, signal conductors $17S_1$ extending in the area of the internal logic circuit 6 establishes connection between macro-cells arranged in the intermediate or long distances. These signal conductors $17S_1$ are used as specified signal conductors for vertical direction extending in the vertical direction (first direction) in the internal logic circuit 6.

In the fourth level interconnection layer 17, in the area of the input/output circuit 2, the signal conductors $17S_1$, the fourth level I/O signal conductors $17S_2$ and clock signal conductors 17C are respectively arranged. The signal conductors $17S_1$ in the area of the internal logic circuit 6 is used as the specified signal conductors for the vertical direction connecting between the macro-cells included in the logic circuit cells 6A or as the specified signal conductors for the vertical direction connection of the macro-cells included in the logic circuit cells 6A and buffer circuits included in the input-/output circuit cells 2B (2A). Namely, the areas above the input/output circuit 2 are used as the connection channel areas, in which the signal conductors 17S$_1$ are arranged. The I/O signal conductors 17S$_2$ establishes connection between the buffer circuits and the external terminals 26S$_2$ (see FIG. 7).

Figure 11:
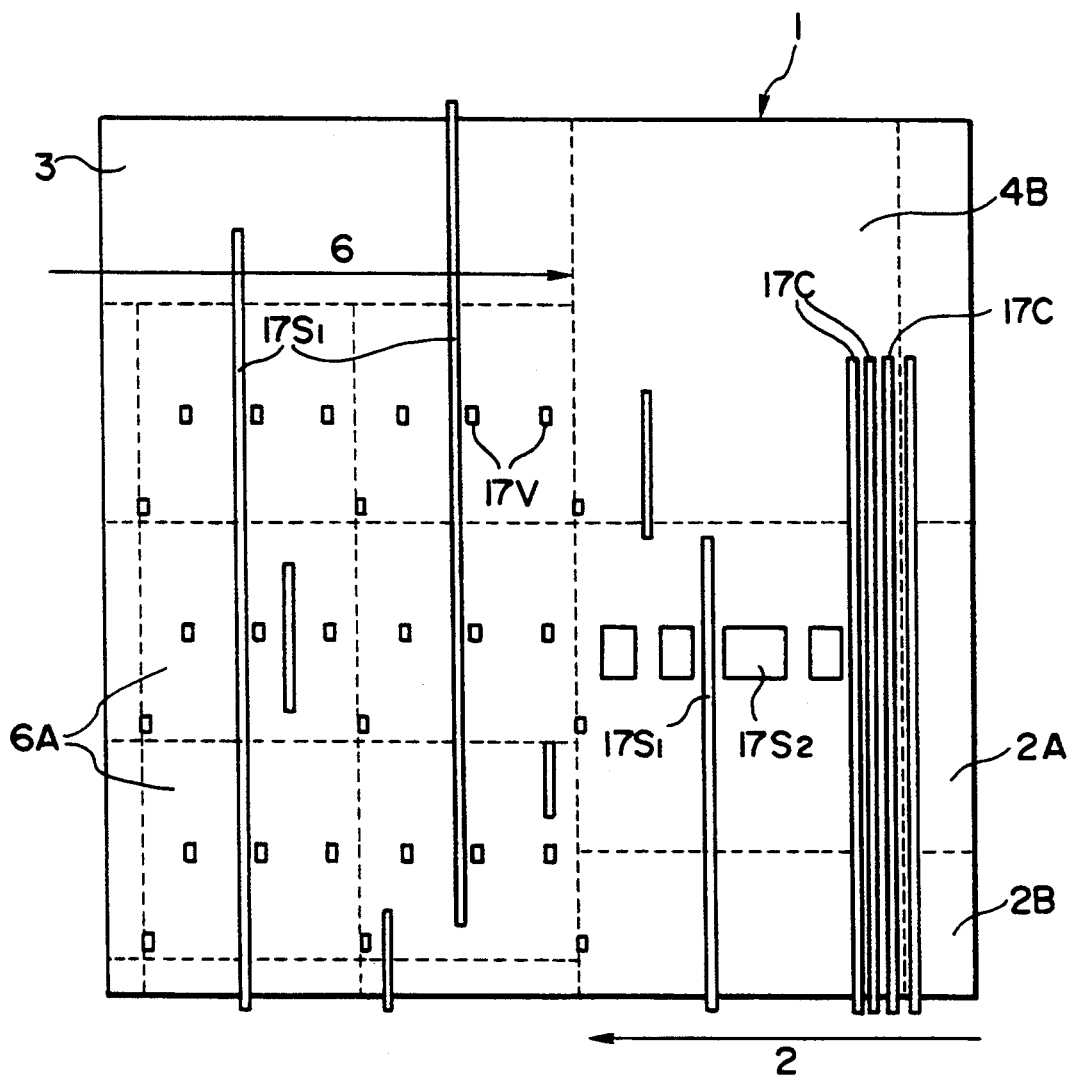
Figure 15:
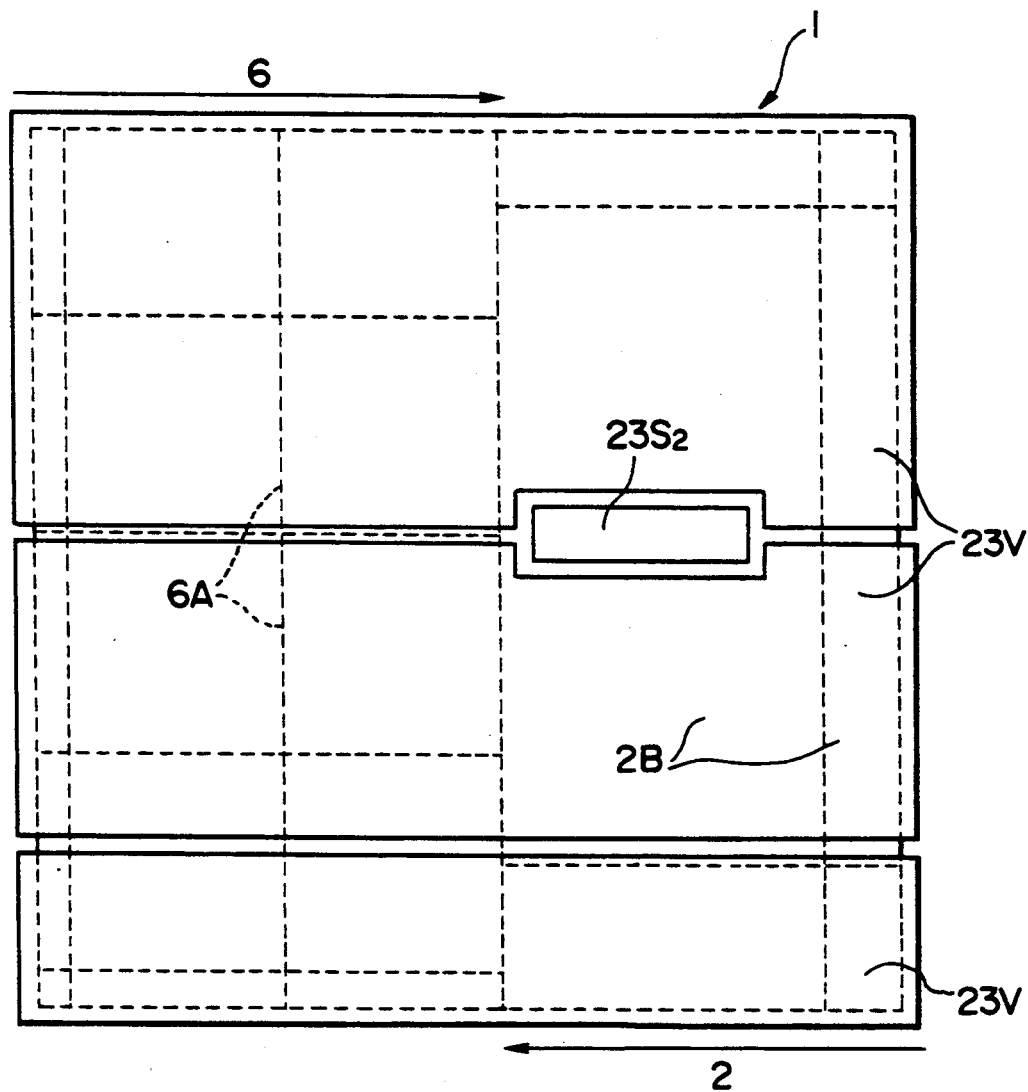

The clock signal conductors 17C are arranged in plural in the boundary over two rows of the input/output circuit cells of each of the input/output circuit blocks of the input/output circuit 2 and extend in the same vertical direction as the signal conductors 17S$_1$, as shown in FIG. 10, FIG. 11 (plan view of the major part of another area of the ASIC device 1) and FIG. 15. These clock signal conductors 17C are used as the specified signal conductors for vertical direction connection between the first stage clock amplifier 4A and the intermediate stage clock amplifiers 4B or between the intermediate stage clock amplifiers 4B and the final stage clock amplifiers 4C. These clock signal conductors 17C are arranged in the area above the input/output circuit 2 (namely taking the areas of the input/output circuit 2 as the connection channel areas) and not arranged in the areas above the internal logic circuit 6. Therefore, the occupied area for arranging the clock signal conductors 17C can be reduced. Also, since the areas conventionally used as connection channel areas of the internal logic circuit can be freely used for connection between the macro-cells to facilitate arrangement of the macro-cells in the internal logic circuit 6.

The fourth level interconnection layer 17 is formed by a laminated layer, in which an Al alloy layer is laminated over a TiW layer, for example, and has a medium thickness of the order of approximately 1.0 μm, similar to the second level interconnection layer 13. Also, similar to the second level interconnection layer 13, the fourth level interconnection layer 17 is electrically connected to the lower third level interconnection layer 15 through the intermediate conductive layers 16 formed in the connection holes formed through the inter-layer insulating layer.

Figure 12:
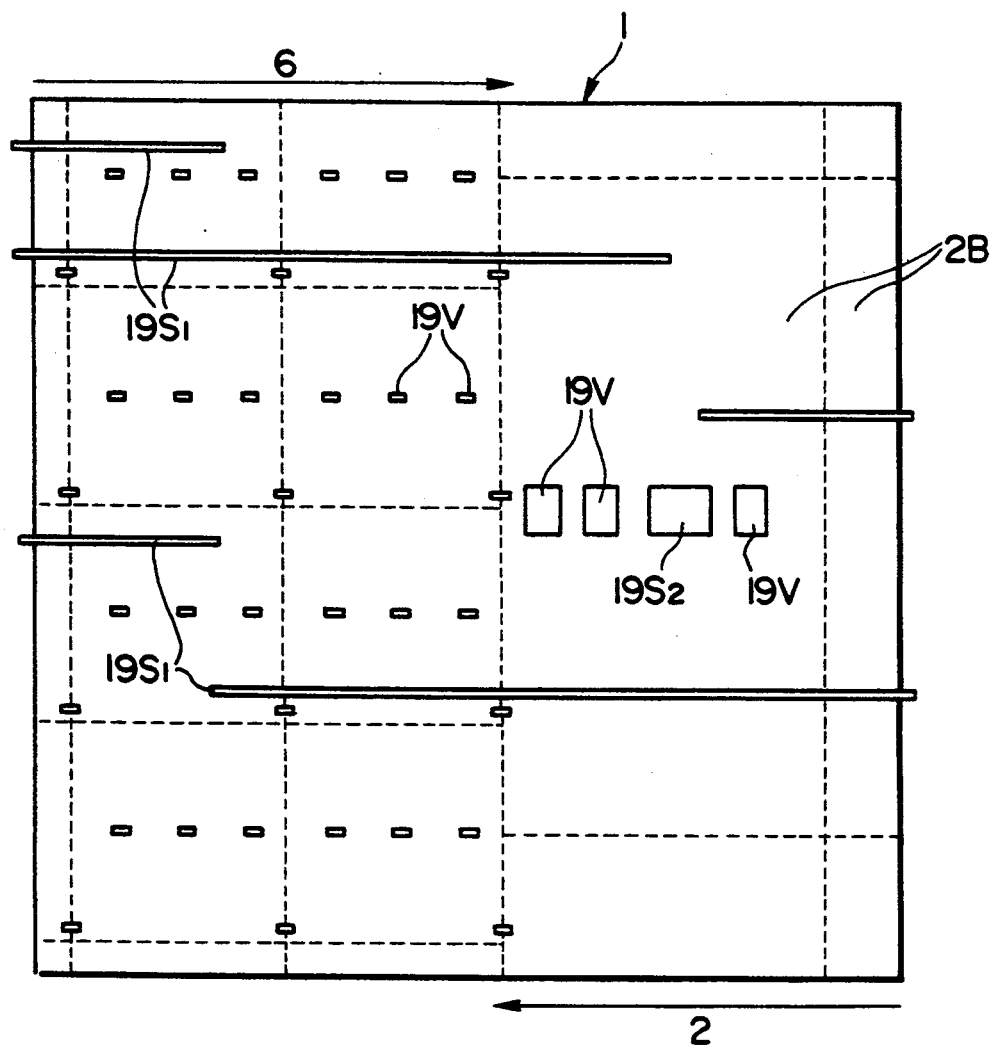

Above the fourth level interconnection layer, a fifth level interconnection layer 19 is arranged via an inter-layer insulating layer. The fifth level inter-connection layer 19 effects desired electrical connection in the fourth level interconnection layer 17 through the connection holes (through holes) formed through the inter-layer insulating layer. As shown in FIG. 7 and FIG. 12 (plan view of the major part of the ASIC device 1), in the fifth level interconnection layers 19, signal conductors 19S$_1$ extending in the areas of the internal logic circuit 6 and input/output circuit 2 establishes connection between macro-cells arranged in the inter-mediate or long distances. These signal conductors 19S$_1$ are used as specified signal conductors for lateral direction extending in the lateral direction (second direction) in the internal logic circuit 6.

These signal conductors 19S$_1$ can connect the macro-cells respectively included in the internal logic circuits which are arranged on left and right sides of the input-/output circuit blocks, across the area of the input/output circuit blocks of the input/output circuit 2. Namely, the areas above the input/output circuit 2 are used as the connection channel areas, and in this connection channel areas, the signal conductors 19S$_1$ are arranged.

On the other hand, in the area of the input/output circuit 2, the I/O signal conductors 19S$_2$ for connecting the buffer circuits and the external terminals 26S$_2$ are arranged (see FIG. 7).

Figure 13:
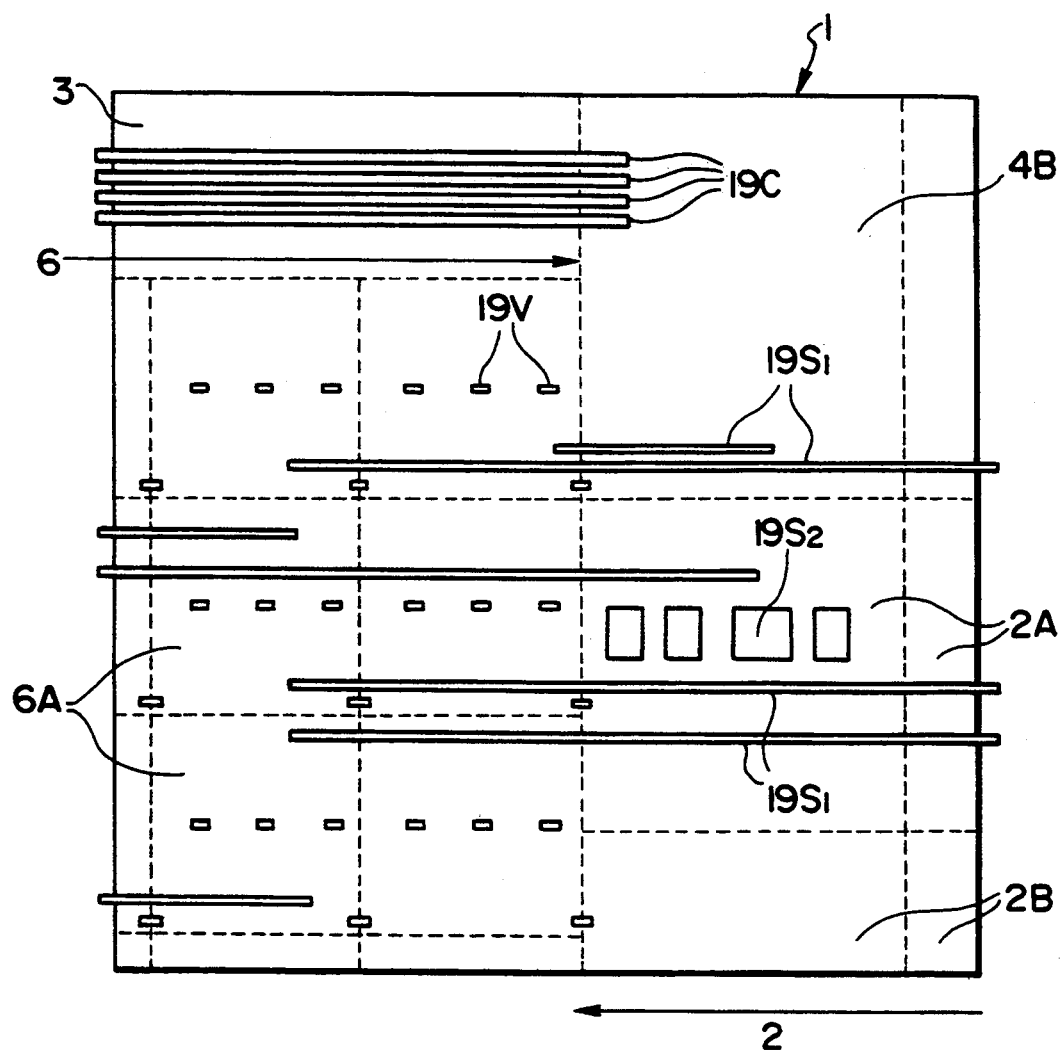

As shown in FIGS. 13 (plan view of the major part of another area of the ASIC device 1) and 5, in the fifth level interconnection layers, in the area above the reference voltage generating circuit 3, clock signal conductors 19C are arranged. The clock signal conductors 19C extend in the same lateral direction as the signal conductors 19S$_1$. Similar to the clock signal conductors 17C of the fourth level interconnection layer, these clock signal conductors 19C are used as the specified signal conductors for lateral direction connection between the first stage clock amplifier 4A and the intermediate stage clock amplifiers 4B or between the intermediate stage clock amplifiers 4B and the final stage clock amplifiers 4C. These clock signal conductors 17C are arranged in the area above the reference voltage generating circuit 3 (namely taking areas of the reference voltage generating circuit 3 as the connection channel areas) and not arranged in the area above the internal logic circuit 6. Therefore, the occupied area for arranging the clock signal conductor 19C can be reduced. Also, since the areas conventionally used as connection channel areas of the internal logic circuit can be freely used for connection between the macro-cells to facilitate arrangement of the macro-cells in the internal logic circuit 6.

The fifth level interconnection layer 19 is formed by a laminated layer, in which an Al alloy layer is laminated over a TiW layer, for example, and has a medium thickness of the order of approximately 1.0 μm, similar to the second level interconnection layer 13. Also, similar to the second level interconnection layer 13, the fifth level interconnection layer 19 is electrically connected to the lower third level interconnection layer 15 through the intermediate conductive layers 18 formed in the connection holes formed through the inter-layer insulating layer.

Figure 14:
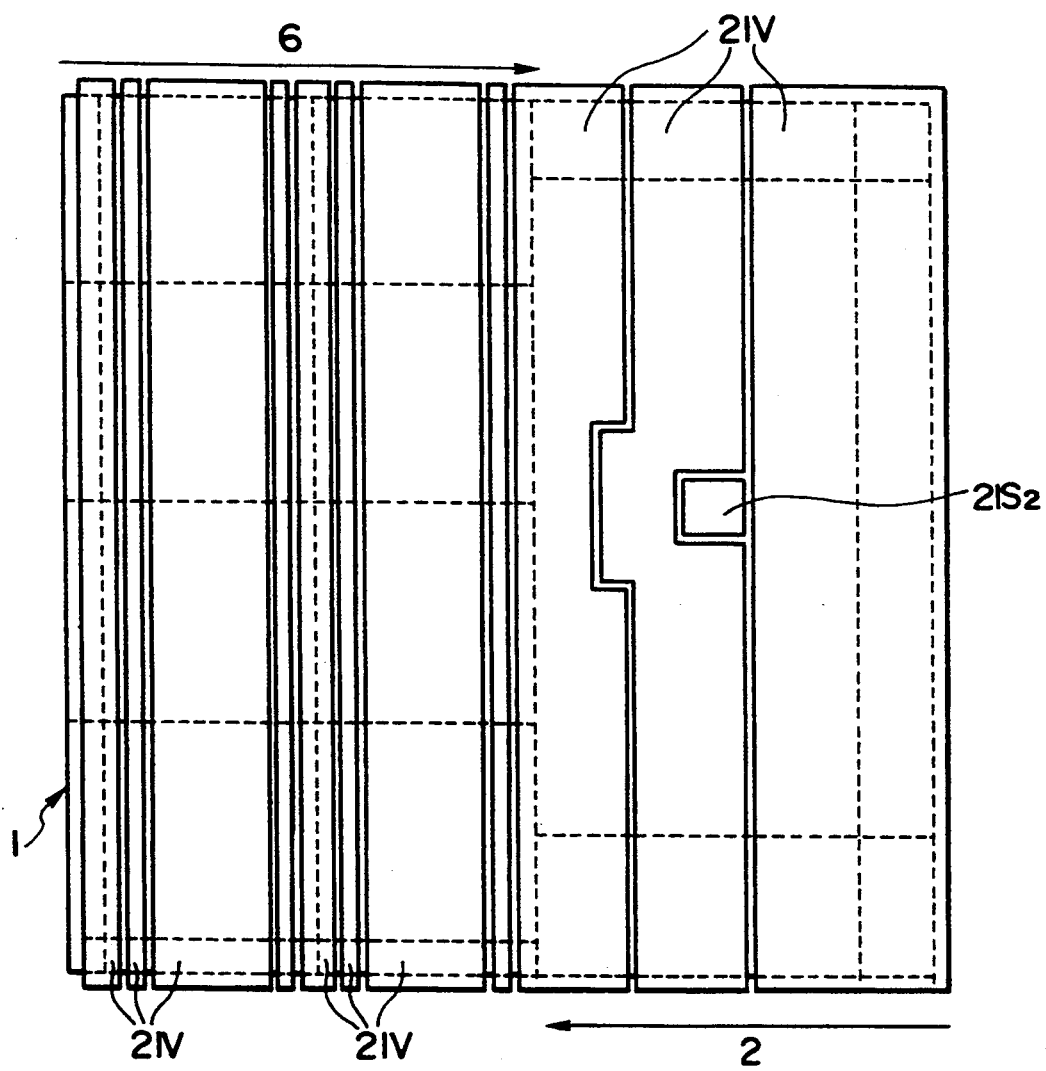

Above the fifth level interconnection layer, a sixth level interconnection layer 21 is arranged via the inter-layer insulating layer. The sixth level interconnection layer 21 is electrically connected to the fifth level interconnection layer 19 through the connection holes (through holes) formed through the inter-layer insulating layer. As shown in FIG. 7 and FIG. 14 (plan view of the major part of the ASIC device 1), most of the sixth level interconnection layer 21 is formed as power supply conductors 21V. These power supply conductors 21V are used in each of the internal logic circuit 6 and the input/output circuit 2 as specified power supply conductors for vertical direction extending in the vertical direction (first direction).

The power supply conductors 21V extending in the area above the internal logic circuit 6 are capable of supplying power to the macro-cells or the like through the fifth level power supply conductors 19V, the fourth level power supplied conductors 17V, the third level power supply conductors 15V, the second level power supply conductors 13V and the first level power supply conductors 11, respectively, which are arranged regularly in the area of the internal logic circuit 6. Similarly, the power supply conductors 21V extending in the area above the input/output circuit 2 can supply power to the buffer circuits through the fifth level power supply conductors 19V, the fourth level power supplied conductors 17V, the third level power supply conductors 15V, the second level power supply conductors 13V and the first level power supply conductors 11, respectively, which are arranged regularly in the area of the input/output circuit 2. This power supply is performed substantially in the vertical direction with respect to the main surface of the monocrystalline substrate from the upper layer to the lower layer (from the sixth level power supply conductors 21V to the macro-cells or the buffer circuits).

On the other hand, in the area of the input/output circuit 2, the I/O signal conductors 21S$_2$ for connecting the buffer circuits and the external terminals 26S$_2$ are arranged (see FIG. 7).

The sixth level interconnection layer 21 is formed by a laminated layer, in which an Al alloy layer is laminated over a TiW layer, for example, similar to the second level interconnection layer 13 and has a large thickness of the order of approximately 2.0 μm in order to provide low current density (for increasing an allowable current value). Also, for the same reason, in the sixth level interconnection layers 21, the power supply conductors 21V are provided with wider conductor width in comparison with that of the lower level signal conductors (e.g., the signal conductors 19S$_1$ of the fifth level interconnection layers 19). Furthermore, the sixth level interconnection layer 21 is electrically connected to the lower fifth level interconnection layer 19 through the intermediate conductive layers 20 formed in the connection holes formed through the inter-layer insulating layer, similar to the second level inter-connection layer 13.

Above the sixth level interconnection layer, a seventh level interconnection layer 23 is arranged via the inter-layer insulating layer. The seventh level interconnection layer 23 is electrically connected to the sixth level interconnection layer 21 through the connection holes (through holes) formed through the inter-layer insulating layer. As shown in FIG. 7 and FIG. 15 (plan view of the major part of the ASIC device 1), and similar to the sixth level interconnection layer 21, most the seventh level interconnection layers 23 are formed as power supply conductors 23V. These power supply conductors 23V are used in each of the internal logic circuit 6 and the input/output circuit 2 as specified power supply conductors for lateral direction extending in the lateral direction (second direction). Namely, the power supply conductors 23V extends over the internal logic circuit 6 and the input/output circuit 2 and later-mentioned power supply external terminal 26V (FIG. 7) and power supply solder bump electrode 7V are arranged above the internal logic circuit 6, the power can be supplied to the areas of the internal logic circuit 6 and to the buffer circuit of the input/output circuit 2 through a minimum distance.

On the other hand, in the area of the input/output circuit 2, the I/O signal conductors 23S$_2$ for connecting the buffer circuits and the external terminals 26S$_2$ are arranged (see FIG. 7).

The seventh level interconnection layer 23 is formed by a laminated layer, in which an Al alloy layer is laminated over a TiW layer, for example, similar to the sixth level interconnection layer 21 and has a large thickness of the order of approximately 2.0 μm. In the seventh level interconnection layers 23, the power supply conductors 23V are provided with wider conductor width in comparison with that of the lower level signal conductors. Furthermore, the seventh level inter-connection layer 23 is electrically connected to the lower sixth level interconnection layer 21 through the intermediate conductive layers 22 formed in the connection holes formed through the inter-layer insulating layer, similar to the second level interconnection layer 13.

Figure 16:
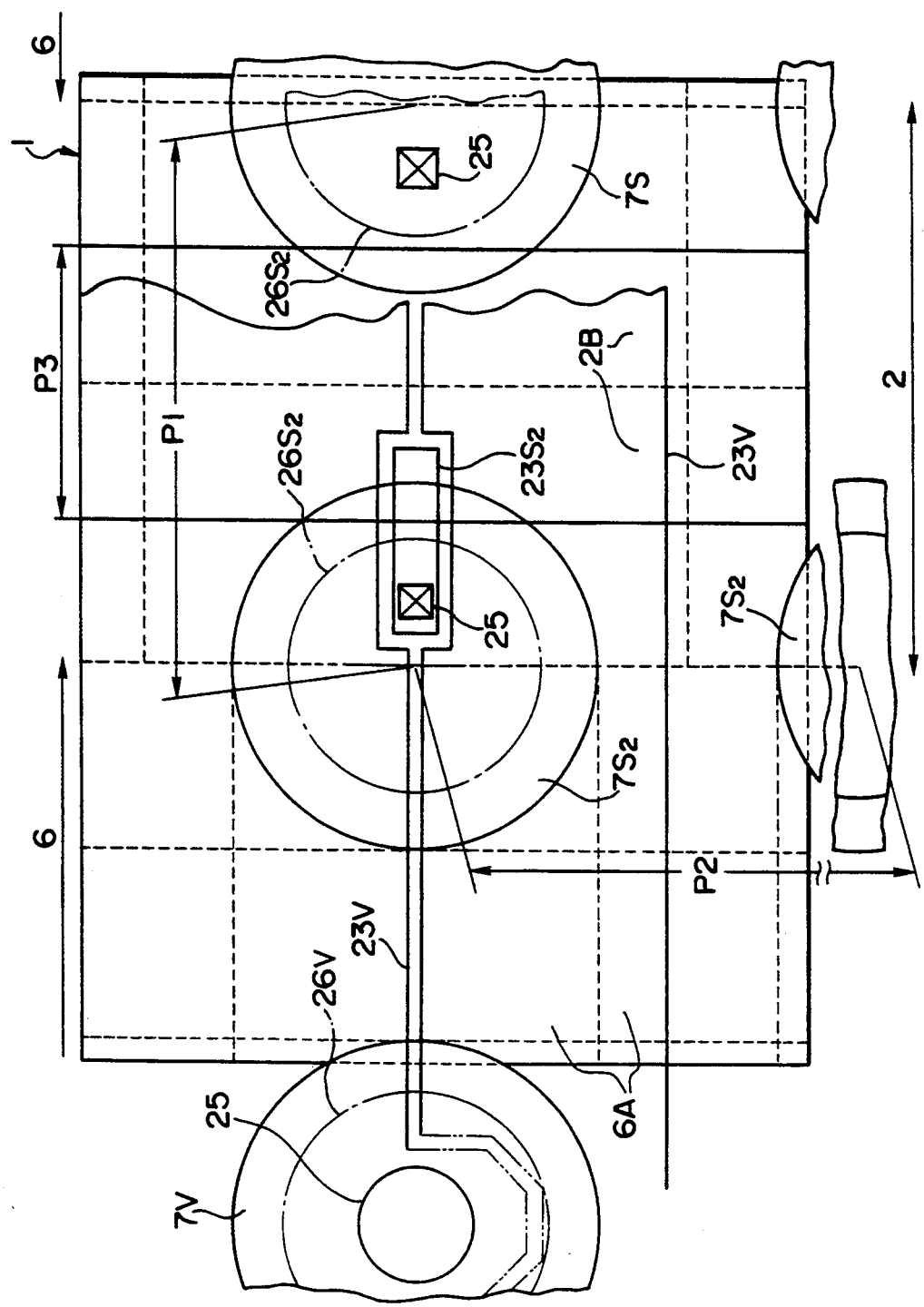

As shown in FIG. 7 and FIG. 16 (plan view of the major part of the ASIC device 1), the seventh level interconnection layer as the upper most layer among the seven interconnection layer structure is electrically connected to contacts or external terminal 26. This external terminals 26 receive input signals, a clock signal and power and so forth to the ASIC device 1 and deliver output signals from the ASIC device 1.

The external terminals 26 are connected to the seventh level interconnection layer 23 through openings 25 formed in a final protection layer (final passivation layer 24) in the respective areas of the input/output circuit 2 and the internal logic circuit 6. Also, the external terminals 26 are exposed from the surface of the final protection layer. The ASIC device 1 according to the shown embodiment is mounted on a mounting board, such as a mother board, a testing board, a printed circuit board or the like by way of face-down bonding method (CCB: controlled Collapse Bonding). Accordingly, the external terminals 26 may be formed by laminating a Cr layer, a Cu layer and an Au layer respectively, for example, primarily for forming a barrier metal film for eliminating mutual diffusion between the seventh level interconnection layer 23 and the later-mentioned electrical connection bumps or solder bump electrodes 7 and base conductor film for enhancing wetting of the solder bump electrodes.

The external terminals 26S$_2$ arranged in the areas above the input/output circuit 2 are applied with either the input signal, the output signal and the input/output signal and thus used as the external terminals for input/output signals. The input/output signal external terminals 26S$_2$ are arranged one per every input/output circuit cell 2A or 2B of input/output circuit 2. The input/output signal external terminals 26S$_2$ arranged in the area above the input/output circuit cell 2A or 2B of the input/output circuit 2 are electrically connected to the buffer circuits via input/output signal conductors 23S$_2$, 21S$_2$, 19S$_2$, 17S$_2$, 15S$_2$, 13S$_2$ and 11. Namely, the buffer circuit included in the input/output circuit cell 2A or 2B is connected to an external terminal 26S$_2$ arranged above the buffer circuit in substantially vertical direction relative to the one main surface of the monocrystalline silicon substrate 10. The connection between the buffer circuit and the external terminal 26S$_2$ have substantially no extension or by-pass in the plane parallel to one main surface of the monocrystalline silicon substrate.

On the other hand, the external terminals 26V arranged in areas above the internal logic circuit 6 are supplied with either of the low voltage power (E), the emitter-follower power (T) or the grounding power (C) and thus used as the external terminals for power supply. The power supply external terminal 26V is, as shown in FIG. 16, connected to the projecting portion (the area where the contact area is increased) of the power supply conductors 23V of the lower seventh level interconnection layer through an opening 25. Namely, in connection between the power supply external terminals 26V and the power supply conductors 23V of the seventh level inter-connection layers, the current density is held small (the allowable current value is increased). The power supply external terminals 26V supply power to the power supply conductors 23V of the lower seventh level interconnection layer. The power supply conductor 23V of the seventh level interconnection layer further distribute the power to the lower level power supply conductors 19V, 17V, 15V, 13V, 11 via the power supply conductor 21V of the lower sixth level interconnection layer in order. The distributed power is supplied to the macro-cells arranged in the internal logic circuit 6, the buffer circuit included in the input/output circuit 2, the clock amplifier circuit 4, the reference voltage generating circuit 3 and so forth.

It should be noted that, since the power supply array for power of the different type to the power supplied to the power supply external terminals 26 corresponds to the kind and arrangement of the solder bump electrode 7, description will be given when the solder bump electrodes are described later.

Figure 17:
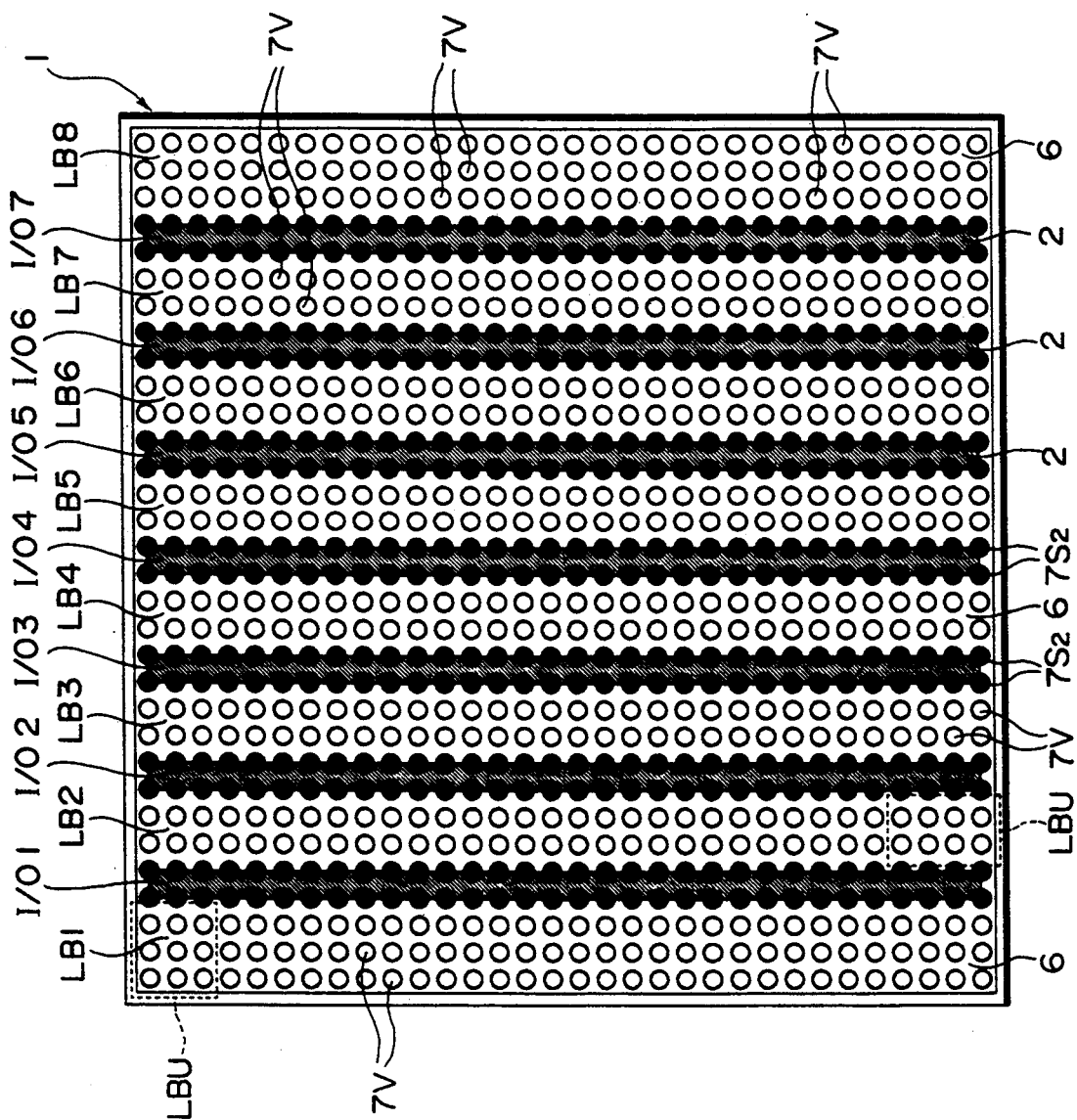
FIG. 17 is a plan view showing arrangement of solder bump electrodes of the ASIC device shown in FIG. 7.

As set forth above, since the shown first embodiment of the ASIC device 1 is mounted by way of the face-down bonding method, the solder bump electrodes 7V and $7S_2$ are formed on the external terminals 26V and $26S_2$ of the ASIC device upon mounting, after completion of fabrication of the ASIC device, as shown in FIG. 17 (layout diagram of chip illustrating arrangement of the electrodes), FIG. 7 and FIG. 16. Although the solder bump electrodes 7V and $7S_2$ are formed on the ASIC device in the first embodiment, basically, they may be formed either on the mounting board or both on the ASIC device and on the mounting board.

The solder bump electrodes $7S_2$ in areas of the input/output circuit 2 are used as the solder bump electrodes for input/output signals. An input/output signal solder bump electrode $7S_2$ is arranged for each of the input/output circuit cells 2A or 2B and arranged on the input/output signal external terminal $26S_2$ connected to the buffer circuit included in the input/output circuit cell 2A or 2B. Since each of the input/output circuit blocks I/O1–I/O7 of the input/output circuit 2 are formed by two rows of the input/output circuit cells, the solder bump electrodes $7S_2$ are arranged in two in the lateral direction and in more than two in the vertical direction (first direction) as shown in FIG. 17. Furthermore, since each input/output circuit 2 is divided into a plurality of the input/output circuit blocks in the lateral direction, the solder bump electrodes $7S_2$ form a plurality of the rows corresponding to the number of division. Namely, as shogun in FIG. 17, the input/output signal solder bump electrodes $7S_2$ are arranged in a stripe fashion in the ASIC device 1.

Each of the solder bump electrodes $7S_2$ arranged in the areas of the input/output circuit 2 is arranged to place its center point about the center portion of a longer side of an associated rectangular input/output circuit cell 2B with an arrangement pitch in the vertical direction consistent with the pitch of the input/output circuit cells 2B in the vertical direction as shown in FIG. 16. Namely, the solder bump electrodes $7S_2$ are arranged with a regular arrangement pitch P2 in the vertical direction. Thus, once the arrangement pitch P2 of the solder bump electrodes $7S_2$ in the vertical direction is determined, the input/output circuit cells 2B are arranged in accordance with the determined pitch P2. Normally, since the minimum process dimension of the input/output signal solder bump electrodes $7S_2$ is greater than the minimum process dimension in the production process of the semiconductor elements and the interconnection conductors in the ASIC device, when the arrangement pitch P2 of the solder bump electrodes $7S_2$ in the vertical direction is determined as the minimum arrangement pitch, an arrangement pitch P1 in the lateral direction is determined to be substantially an equal dimension. Since each of the input/output circuit blocks I/O1–I/O7 of the input/output circuit 2 is formed with two rows of the input/output circuit cells, there is no limitation for the lateral arrangement of the input/output circuit cells 2B. Also, since the minimum process dimension of the semiconductor elements of the input/output circuit cells 2B is small and the input/output circuit cells 2B are formed in a rectangular configuration, it becomes possible to make the arrangement pitch P3 of the input/output circuit cells 2B (2A) smaller than the arrangement pitch P1 in the lateral direction of the input/output signal solder bump electrodes $7S_2$. In other words, the lateral arrangement pitch P3 of the input/output circuit cells 2B is not restricted by the arrangement pitches P1 and P2 of the solder bump electrodes $7S_2$ and can be made smaller in comparison with the arrangement pitches P1 and P2. Therefore, the lateral dimension of the input/output circuit cells 2B can be reduced.

Returning to FIG. 7, the solder bump electrodes 7V in the area of the internal logic circuit 6 are used as solder bump electrodes for power supply. The power supply solder bump electrodes 7V are arranged substantially with the same pitches as the arrangement pitches P1 and P2 and arranged over substantially overall area of the internal logic circuit 6 (logic circuit blocks).

The power supply solder bump electrodes 7V are arranged in two in the lateral direction (second direction) and in more than two in the vertical direction (corresponding number to the input/output signal solder bump electrodes $7S_2$) in the logic circuit blocks LB1–LB8 arranged in the lateral direction (second direction of the internal logic circuit 6, except for the first and final stage logic circuit blocks LB1 and LB8 as viewed in the second direction. For the logic circuit blocks LB1 and LB8, three power supply solder bump electrodes 7V are arranged in the lateral direction, respectively.

Figure 18:
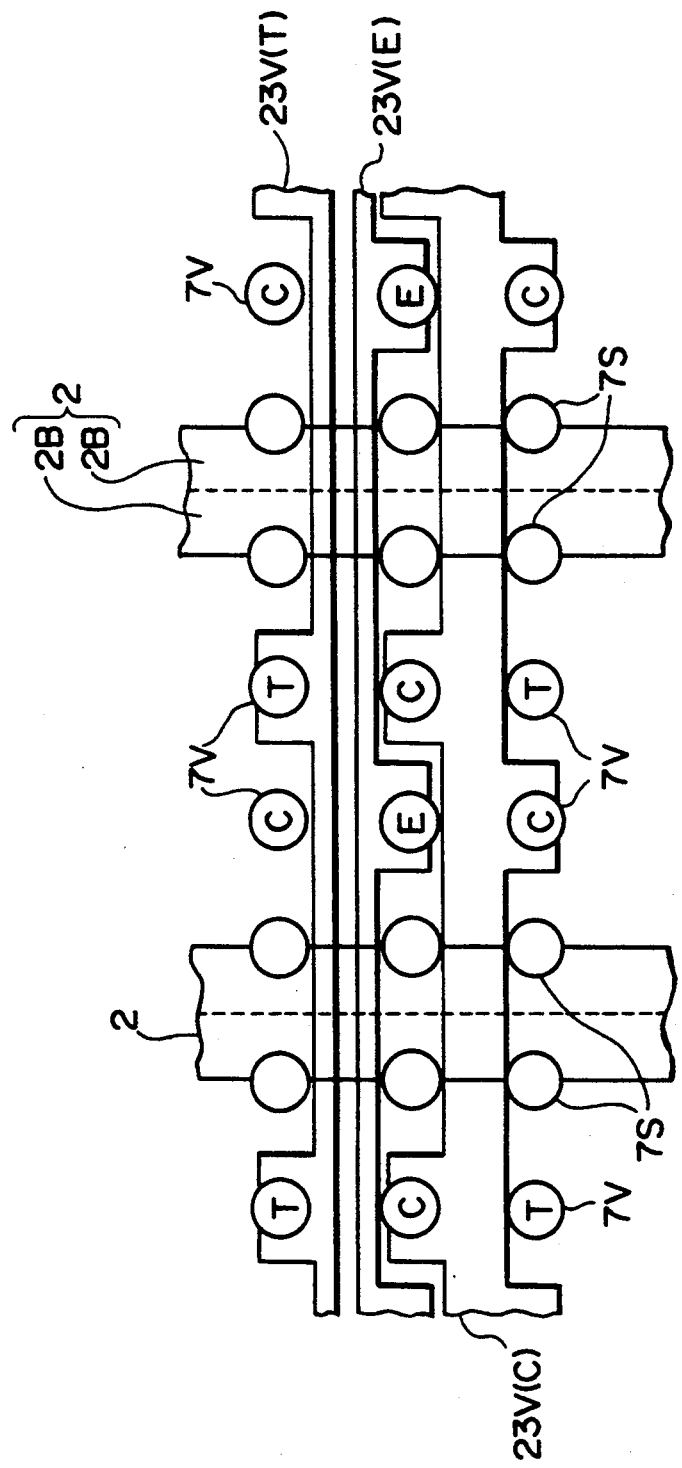
FIG. 18 is an illustration showing the ASIC of FIG. 7, particularly showing the arrangement of the power source solder bump electrodes.

Except for the logic circuit blocks LB1 and LB8, the power supply solder bump electrodes 7B in the area of the logic circuit blocks LB2–LB7 are provided with grounding power (C), low voltage power (E), grounding power (C), low voltage power (E) repeatedly in order, as shown in FIG. 18 (layout diagram of the electrodes). The row of the solder bump electrodes 7V adjacent to the above-mentioned solder bump electrode row in the lateral direction are provided with emitter-follower power (T), grounding power (C), emitter-follower power (T) and grounding power (C) arranged repeatedly in order in the vertical direction. Namely, the power supply solder bump electrodes 7V are arranged with the grounding power bump electrodes (C) in a zig-zag fashion in the vertical direction, with an offset by one pitch in the vertical direction so that the grounding power bump electrodes (C) may not be aligned, and the low voltage power bump electrodes (E) and the emitter-follower power bump electrodes (T) are alternated in a zig-zag fashion. Therefore, the grounding power bump electrodes (C) surround the low voltage power bump electrodes (E) and the emitter-follower power bump electrodes (T). The power supply solder bump electrodes 7V arranged in the internal logic circuit 6 may supply power from both of the left and right sides of each of the input/output circuit blocks through an associated lower level external terminal 26V and an associated power supply conductor 23V in the seventh level interconnection layer.

The foregoing first embodiment of the ASIC device 1 enjoys the following effects.

(1) Since the internal logic circuit 6 is divided into a plurality of logic blocks BL, the input/output circuit 2 divided into a plurality of input/output circuit blocks I/O is arranged with respect to the logic circuit blocks, the connection length between one input/output circuit block and one logic circuit block can be shortened depending upon the number of division of the internal logic circuit 6, and thus the signal propagation speed between one input/output circuit block and one logic circuit block can be increased. Also, on both sides of the input/output circuit blocks of the input/output circuit 2, the logic circuit blocks of the internal logic circuit 6 are arranged so that respective two logic circuit blocks are connected to one input/output circuit block so as to allow the connection between one input/output circuit block and one logic circuit block with the connection length approximately one-half of the lateral dimension of the logic circuit block (connection length can be shortened to approximately one-half) to increase the signal propagation speed between one input/output circuit block and one logic circuit block to contribute to an increase of the operation speed of the ASIC device 1. Furthermore, since it can provide a higher possibility to make connections from both sides of all of the input/output circuit blocks of the input/output circuit 2 to increase possibilities of connections between each of the input/output circuit blocks and the plurality of logic circuit blocks, usage efficiency of the input/output circuit cells 2A and 2B of the input/output circuit 2 can be improved (presence of input/output circuit cells which are not used forms wasting empty area and reduces number of input/output circuit cells actually used in the unit area), and thus contribute to improvement of the density in the ASIC device 1.

(2) Since a number of input/output circuit cells 2A and 2B in one input/output circuit block I/O positioned in opposition to the a plurality of logic circuit cells of the logic circuit block LB of the internal logic circuit 6 can be increased, and a number of the logic circuit cells 6A and the input/output circuit cells 2A and 2B to be connected through the minimum distance can be increased, the signal propagation speed between these input/output circuit cells 2A and 2B and the logic circuit cells 6A can be increased to contribute to an increase of the operation speed of the ASIC device 1. Also, since the connection length between the input/output circuit cells 2A and 2B and the logic circuit cells 6A can be shortened to reduce the necessary area for connection to increase the density in the ASIC device 1.

(3) Since an equivalent number of or more input/output circuit cells 2B to a case where the input/output circuit 2 is arranged along the periphery of the chip can be arranged, the number of the input/output circuit cells 2B can be increased to permit increasing of terminals or pins in the ASIC device.

(4) Since the input/output circuit cells 2A or 2B of the input/output circuit 2 and the input/output signal external terminals $26S_2$ to be connected thereto can be connected in straight from the upper level layer to the lower level layer without by-passing other input/output circuit cells 2A or 2B or logical circuit cells 6A of the internal logic circuit 6 to permit reduction of the connection length, the signal propagation speed between the input/output signal external terminals $26S_2$ and the input/output circuit cells 2A or 2B can be increased to increase the operation speed of the ASIC device 1. Furthermore, since the input/output signal external terminals $26S_2$ are arranged in the areas above the areas occupied by the input/output circuit cells 2A or 2B of the input/output circuit 2 or parts thereof, the density in the ASIC device 1 can be increased. In addition, since the input/output signal solder bump electrodes $7S_2$ and the input/output circuit cells 2A or 2B can be connected substantially in straight via the input/output external terminals $26S_2$, the operation speed of the ASIC device 1 can be increased.

(5) Since power is supplied through short power supply paths (the length of the power supply conductors 23V of the seventh level interconnection layer forming a part of the power supply path and contributing to the supply path length is equivalent with or less than approximately one-half of the width of the logic circuit block LB in the second direction) from both sides of one input/output circuit block I/O to improve a noise margin in the circuit operation of each input/output circuit block, the reliability of the operation of the ASIC device 1 can be improved. On the other hand, since the power supply external terminals 26V or the power supply external terminal 26V and the power supply solder bump electrodes 7V are arranged in the area above two logic circuit blocks and the area above these logic circuit blocks are used as power supply areas, the occupied areas corresponding to the power supply areas can be reduced to allow increasing of the density in the ASIC device 1.

(6) Since one set of input/output circuit control signal conductors 13I/O are used in common to two rows of the input/output circuit cells of each input/output circuit block to permit neglecting one set of the input/output circuit control signal conductors 13I/O, it becomes possible to reduce the occupied area for connection to permit increasing of the density in the ASIC device 1. Also, for the area corresponding to one set of the input/output circuit control signal conductors 13I/O, the signal conductors or the power supply conductors (signal conductors $13S_1$ in the second level interconnection layer or the power source conductors 13V in the second level interconnection layer) can be arranged to increase the density in the ASIC device 1. Furthermore, since one set of the input/output circuit control signal conductors 13I/O and two rows of the input/output circuit cells can be connected with a minimum distance corresponding to approximately one-half of the input/output circuit block in the first direction to reduce the by-pass conductors for connection, the propagation speed of the control signal can be increased to increase the operation speed of the ASIC device 1. In addition, since the by-passing conduction can be reduced, the occupied area by the connection conductors can be reduced to increase the density in the ASIC device 1.

(7) Since the input/output circuit cells 2B of each input/output circuit block LB are rectangular in which the input/output signal solder bump electrodes $7S_2$ are arranged in the first direction (vertical direction) with the arrangement pitch corresponding to the first direction side of the rectangular cells, and the input/output circuit cells 2B are formed shorter in the second direction corresponding to an increase of the length of the input/output circuit cell 2B in the first direction, the arrangement pitch of the input/output circuit cells 2B in the second direction (arrangement pitch of the row of the input/output circuit cells) can be reduced without restriction of the arrangement pitch P1 of the input/output solder bump electrodes $7S_2$ in the second direction so that the area occupied by the input/output circuit 2 can be reduced to increase the density in the ASIC device 1. Furthermore, by reduction of the area occupied by the input/output circuit 2, the number of the input/output circuit cells 2B (or 2A) of the input/output circuit 2 can be increased to allow the ASIC device 1 to be provided with an increased number of terminals. In addition, by reduction of the area occupied by the input/output circuit 2, the number of the logic circuit cells 6A of the internal logic circuit 6 can be increased.

(8) Since the clock amplifying circuit 4 is divided into one first stage clock amplifier 4A, at least two intermediate clock amplifiers 4B and a plurality of final stage clock amplifiers 4C (in the shown embodiment, four intermediate stage clock amplifiers and sixteen final stage clock amplifiers), the connection length of the first stage clock amplifier 4A and the intermediate stage clock amplifiers 4B are set substantially equal to each other, and all of the clock pulse signal path length from the first stage clock amplifier 4A of the clock amplifying circuit 4 to a plurality of the logic circuit blocks of the internal logic circuit 6 are set uniform, it becomes possible to eliminate phase differences of the clock pulse signal to reduce the circuit operation waiting time of the internal logic circuit 6, and thus to increase the operation speed of the ASIC device 1.

(9) Since the clock amplifying circuit 4 is not arranged in the area of the internal logic circuit 6 but arranged in the area of the input/output circuit 2 (arrange as fixed macro-cells) so as not to disturb regularity of the internal logic circuit 6 (there is no prohibiting area or by-passing area and so forth for circuit arrangement due to the arrangement of the clock amplifying circuit 4), there is no restriction of circuit arrangement (e.g. macro-cells, functional circuit blocks and so forth) due to arrangement of the clock amplifying circuit 4 to facilitate arrangement of logic circuits at any portion in the area of the internal logic circuit 6. As a result, turnaround time for the ASIC device 1 can be shortened and thus can reduce the development cost.

(10) Since the connection patterns for connecting the first stage clock amplifier 4A of the clock amplifying circuit 4 and the intermediate stage clock amplifiers 4B are arranged in the area of the input/output circuit 2 or the area of the reference voltage generating circuit 3 so that a sufficient number of connection conductors for connecting the macro-cells (logic circuits) included in the area of the input/output circuit 6 can be certainly provided (there is no restriction to the number of channels of the connection channel areas), the arrangement efficiency of the macro-cells of the internal logic circuit 6 can be improved to increase the density in the ASIC device 1.

The internal logic circuit 6 is formed primarily with the bipolar transistors. In this construction, since the bipolar transistor has fast response characteristics to increase the operation speed of the internal logic circuit 6, it becomes possible to increase the operation speed of the ASIC device 1.

EMBODIMENT 2

According to the second embodiment, the present invention is applied to an ASIC device having an internal logic circuit and a memory circuit.

Figure 19:
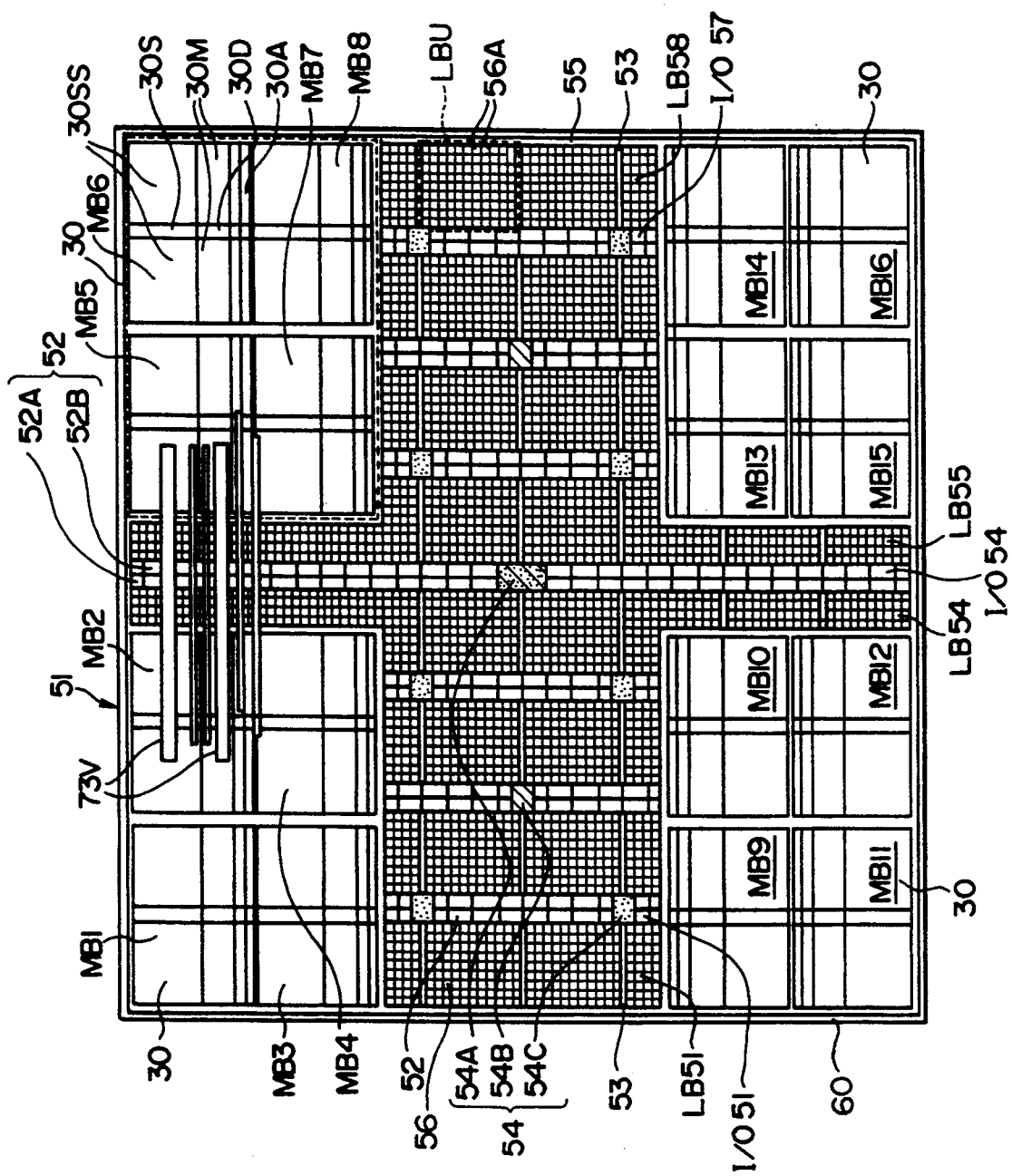
FIG. 19 is a layout diagram of a chip of an ASIC according to another embodiment of the invention.

A construction of the ASIC device (semiconductor integrated circuit device) as the second embodiment of the invention is illustrated in FIG. 19 (chip layout diagram).

The second embodiment of the ASIC device 51 is constructed basically in a similar construction to the foregoing first embodiment of the ASIC device 1. However, as shown in FIG. 19, in addition to input/output circuit 52, internal logic circuit 56, clock amplifying circuit 54 and reference voltage generating circuit 53, a memory circuit 30 is formed in the monocrystalline silicon substrate 60. The shown ASIC device 51 may be used as a cache memory employed in a microprocessor, for example. The memory circuit 30 is provided at the four corners of the rectangular ASIC device 51. The memory circuit 30 has sixteen memory blocks, four being provided at each of the corners. Namely, the memory circuit 30 is divided into a plurality of memory blocks MB1-MB16 (sixteen memory blocks in the second embodiment) and arranged adjacent to a plurality of the logic circuit blocks LB51-LB58, into which the internal logic circuit 56 is divided, on upper and lower sides or left and right sides (arranged in eight on upper and right sides and eight on lower and left sides). The memory circuit 30 is directly connected to the buffer circuit included in the input/output circuit 52, or indirectly connected to the buffer circuit with the macro-cells having a logic function included in the internal logic circuit 6, interposed therebetween.

The memory circuit 30 may be a SRAM (Static Random Access Memory), though not limited thereto. A memory cell in the SRAM for storing one bit information is formed of a flip-flop circuit as information storage portion and two transfer MISFETs (Metal Insulated Semiconductor Field Effect Transistor). The information storage portion includes two driver MISFETs (n-channel type) and two load MISFET (p-channel type), namely, complementary MISFETs. The information storage portion may have high resistance load elements (e.g., polycrystalline silicon layers) in place of the load MISFETs. Such SRAM in which the memory cell is formed of the complementary type MISFETs can reduce the occupation area in comparison with the memory cell formed of bipolar transistors and thus can contribute to an increase of the density on the ASIC device.

Each of the memory blocks MB1-MB16 of the memory circuit 30 mainly comprise an address latch circuit 30A, a driver circuit 30D, a memory cell array 30M, a selector circuit 30S and a selector circuit 30SS for information reading.

Similar to the foregoing first embodiment, seven levels of interconnection layers, for example, are laminated on the substrate 60.

Each of the memory blocks MB1-MB 16 of the memory circuit 30 is basically arranged in the same lateral direction as the lateral direction (second direction), in which power supply conductors 73V of the seventh level interconnection layer are arranged. In the second embodiment (similar to the first embodiment), since the power supply conductors 73V of the seventh level interconnection layer supply three kinds of powers, three conductors form one set. This one set of power supply conductors 73V of the seventh level inter-connection layer is repeatedly arranged with a given pitch in the vertical direction (first direction). Accordingly, by arranging the memory blocks of the memory circuit 30 in the direction, in which the power supply conductors 73V of the seventh level inter-connection layer extend, parasitic capacity created between the power supply conductors 73V of the seventh level interconnection layer added to the memory block can be unified even when the arrangement pitch of the power supply conductors 73V of the seventh level inter-connection layer and the arrangement pitch of the memory blocks are not consistent.

As shown in FIG. 20 (chip layout diagram showing arrangement of electrodes), the ASIC device 51 is provided with the external terminals (dummy external terminals) (not shown) and the solder bump electrodes (dummy solder bump electrodes) in the areas above the internal logic circuit 56 and input/output circuit 52 similar to the foregoing first embodiment, and in addition, in the areas above the memory circuit 30. The input/output signal solder bump electrodes 57S$_2$ are arranged above the input/output circuit 52, the power supply solder bump electrodes 57V are arranged above the internal logic circuit 56. Above the memory circuit 30, the power supply external terminals (not shown) and the power supply solder bump electrodes 57V are arranged. In addition, dummy external terminals and dummy solder bump electrodes 57D which are not connected to the circuit so as not to perform electric functions and thus serve as dummy. Namely, in the areas above the memory circuit 30, the power supply solder bump electrodes 57V are arranged to use the corresponding area as the power supply areas, and to use the solder bump electrodes 57D as dummy as mechanical reinforcement for mounting. The power supply external terminals and the power supply solder bump electrodes 57V arranged above the memory area 30 are arranged along the power supply external terminals and the power supply solder bump electrodes 57V arranged above the internal logic circuit 6 in order to maintain regularity of the arrangement of the power source external terminals and the power supply solder bump electrodes. Also, the external terminals and the solder bump electrodes 57D as dummy are arranged in the area of the memory circuit 30 in place of the arrangement of the input/output circuit 2.

The second embodiment of the ASIC device 51 as set forth above enjoys the following effects in addition to the effects of the first embodiment.

(1) Since the internal logic circuit 56 is partly or wholly arranged between a plurality of memory blocks of the memory circuit 30 so that the connection length between the memory cells of the memory block and the internal logic circuit 56 or its part can be shortened corresponding to number of division of the internal logic circuit 56, an access time when predetermined memory cell of the memory circuit 30 are accessed from the internal logic circuit 56 or the part thereof can be shortened to increase the operation speed of the ASIC device 51 having the memory circuit 30.

(2) Since the power source external terminals are arranged in the area above the memory circuit 30 and the power supply solder bump electrodes 57V are arranged above the power supply external terminals, the density in the ASIC device 51 having the memory circuit 30 can be increased to the extent corresponding to the areas for arrangement of the power supply external terminals and the power supply solder bump electrodes 57V. Also, since the external terminals as dummy not functioning electrically are arranged in the areas of the memory circuit 30 and the dummy solder bump electrodes 57D are arranged on the dummy external terminals, the dummy solder bump electrodes 57D which do not perform electrical function can be used as mechanical reinforcement members upon mounting on the mounting board by way of down-face bonding method to improve reliability of the mounting of the ASIC device 51.

(3) Since even when the arrangement pitch of a plurality of the memory blocks MB (or macro-cells or the functional circuit block) and the arrangement pitch of the power source conductors 73V in the seventh level interconnection layer are inconsistent relative to each other, all of the overlapping condition of a plurality of the memory blocks MB and a plurality of the power source conductors 73V in the seventh level interconnection layer become uniform to increase reliability of the operation of the memory circuit 30 in the ASIC device 51.

(4) The memory circuit 30 mainly includes complementary type MISFETs. With this constriction, since the complementary MISFETs can be fabricated in fine patterns, the area occupied by the memory circuit 30 can be reduced to increase the density in the ASIC device 51.

The present invention has been discussed in terms of the practical embodiments. However, the present invention should not be limited to the shown constructions and can, of course, be modified in any ways without departing from the principle of the invention.

For instance, the present invention is applicable to any semiconductor integrated circuit devices employing the gate array system, standard cell system, custom system, semi-custom system or master slice system.

Also, the present invention is applicable to ASIC devices, in which bipolar transistors and complementary MISFETs are mounted on a common monocrystalline substrate.

Furthermore, the present invention is not limited to the semiconductor integrated circuit device but may be applicable to a mounting board, such as a mother board, test board and so forth.

What is claimed is:

1. A semiconductor IC device comprising an input/output circuit and an internal logic circuit connected to said input/output circuit, with both formed in a main surface of a semiconductor substrate of a generally rectangular shape having a predetermined thickness, wherein:

an area on said main surface for providing said internal logic circuit is divided into at least three first areas where logic circuit blocks are formed therein such that edges of the first areas for the logic circuit blocks defined by the division on the main surface of said substrate extend in a first direction substantially parallel with a pair of opposite sides of said substrate;

an area on said main surface for providing said input/output circuit is divided into at least two second areas where input/output circuit blocks are formed therein such that edges of the second areas for the logic circuit blocks defined by the division on the main surface of said substrate extend in said first direction; and each of said input/output circuit blocks in said second areas is sandwiched by and electrically connected to adjacently arranged two of said logic circuit blocks in said first areas, wherein each of said logic circuit blocks includes a plurality of logic circuit cells aligned in said first direction and in a second direction which is substantially perpendicular to said first direction, each of said input/output circuit blocks includes a plurality of input/output circuit cells aligned in said first and second directions in which the number of said input/output circuit cells aligned in said second direction is smaller than that in said first direction so that said input/output circuit blocks are arranged in the form of stripes.

2. A semiconductor IC device according to claim 1, wherein a total length of said input/output circuit represented by a product of a length of one input/output circuit cell measured in said first direction and the number of all of said input/output circuit cells constituting said input/output circuit is larger than a peripheral length of said substrate.

3. A semiconductor IC device according to claim 1, further comprising a multi-level interconnection structure formed on the main surface of said semiconductor substrate and an array of contacts provided over an outermost surface of said multi-level interconnection structure with a protective layer interposed therebetween, wherein said array of contacts includes input/output signal contacts, one provided for each of said input/output circuit cells and electrically connected thereto, said input/output signal contacts being arranged over said input/output circuit cells as viewed in a thicknesswise direction of said substrate.

4. A semiconductor IC device according to claim 3, further comprising an electrical connection bump formed on each of said input/output signal contacts and electrically connected therewith.

5. A semiconductor IC device according to claim 3, wherein:
said array of contacts further includes power supply contacts aligned to extend in said first direction on said protective layer;
power supply conductors are provided to extend in said second direction, within said multi-level interconnection structure, over at least one of said input/output circuit blocks and adjacently arranged two of said logic circuit blocks sandwiching said one input/output circuit block, said power supply conductors being connected to those of said power supply contacts which are provided over associated adjacently arranged two logic circuit blocks; and
each of said power supply conductors is connected to said one input/output block.

6. A semiconductor IC device according to claim 5, further comprising an electrical connection bump formed on each of said input/output signal contacts arranged over said input/output cells as viewed in a thicknesswise direction of said substrate and another electrical connection bump formed on each of said power supply contacts provided over associated adjacently arranged two logic circuit blocks as viewed in said thicknesswise direction of said substrate.

7. A semiconductor IC device according to claim 3, wherein:
the number of said input/output circuit cells aligned in said second direction in each of said input/output circuit blocks is two so that each of said stripes of input/output circuit blocks includes two rows of input/output circuit cells; and
a plurality of sets of input/output circuit control signal conductors are provided to extend in said first direction within said multi-level interconnection structure, one set being provided over said two rows of input/output circuit cells of each of said input/output circuit blocks, each of said plurality of sets of input/output circuit control signal conductors being connected to the two rows of input/output circuit cells of their associated input/output circuit block.

8. A semiconductor IC device according to claim 7, wherein:
each of said input/output circuit cells of each of said input/output circuit blocks is substantially in a rectangular shape having a first pair of sides extending in said first direction and a second pair of sides extending in said second direction as viewed on the main surface of said substrate, said second pair being longer than said first pair;
the input/output circuit cells are arranged in said first direction with a pitch substantially equal to a pitch with which said electrical connection bumps, one provided for each of said input/output circuit cells, are arranged in said first direction;
the input/output signal contacts for each of said input/output circuit blocks are arranged in said second direction on said protective layer with a pitch substantially equal to said pitch with which said electrical connection bumps for said input/output circuit cells are arranged in said first direction; and
the input/output circuit cells of each of said input/output circuit blocks are arranged in said second direction with a pitch smaller than said pitch for the arrangement of the input/output signal contacts in said second direction and of the electrical connection bumps for said input/output circuit cells in said first direction.

9. A semiconductor IC device according to claim 1, further comprising a plurality of memory blocks formed adjacent to at least one of said logic blocks in the main surface of said substrate, said memory blocks being connected to said at least one of said logic blocks.

10. A semiconductor IC device according to claim 9, further comprising a multi-level interconnection structure formed on the main surface of said semiconductor substrate and an array of contacts provided over an outermost surface of said multi-level interconnection structure with a protective layer interposed therebetween, wherein said array of contacts includes power supply contacts and dummy contacts provided over said memory blocks on said protective layer, said power supply contacts being connected to said memory blocks while no electrical connection is made to said dummy contacts, and an electrical connection bump formed on each of said power supply contacts and a dummy bump formed on each of said dummy contacts.

11. A semiconductor IC device comprising an input/output circuit, an internal logic circuit connected to said input/output circuit and a clock amplifying circuit connected to said internal logic circuit formed in a main surface of a semiconductor substrate of a generally rectangular shape having a predetermined thickness, said clock amplifying circuit including a first stage clock amplifier and a second stage clock amplifier connected in cascade with said first stage clock amplifier, wherein:
an area on said main surface for providing said internal logic circuit is divided into a plurality of first areas where logic circuit blocks are formed therein such that edges of the first areas for said logic circuit blocks defined by the division on the main surface of said substrate extend in a first direction substantially parallel with a pair of opposite sides of said substrate;

an area on said main surface for providing said input/output circuit is divided into a plurality of second area where input/output circuit blocks are formed therein such that edges of the second areas for the logic circuit blocks defined by the division on the main surface of said substrate extend in said first direction;

each of said input/output circuit blocks in said second areas is sandwiched by and electrically connected to adjacently arranged two of said logic circuit blocks in said first areas;

said first stage clock amplifier is arranged in a part of said second area for said input/output circuit blocks which is located in a central portion of the main surface of said substrate;

said second stage clock amplifiers are arranged in parts of said second areas for said input/output circuit blocks which are located on outermost sides among the input/output circuit blocks as viewed in said second direction;

lengths of connection conductors between said first stage clock amplifier and said second stage clock amplifiers are substantially equal to each other; and each of said second stage clock amplifiers is connected to those two of said logic circuit blocks which are arranged adjacent to each other and sandwich one input/output circuit block which is located on one of two outermost sides among the input/output circuit blocks as viewed in said second direction.

12. A semiconductor IC device according to claim 11, wherein:

each of said logic blocks of said internal logic circuit is further divided into a plurality of logic circuit block units such that edges of the logic circuit blocks units defined by the division on the main surface of said substrate extend in said second direction;

reference voltage generators are formed between said logic circuit block units in the main surface of said substrate as viewed in said second direction, said reference voltage generators serving to generate reference voltages to be supplied at least two said clock amplifier circuit; and connection conductors connected to said first stage clock amplifier and connection conductors connected to said second stage clock amplifiers are arranged in areas of said input/output circuit blocks and of said reference voltage generators.

13. A semiconductor IC device comprising:

a semiconductor substrate of a generally rectangular shape having a predetermined thickness and having a main surface;

an internal logic circuit having a plurality of logic circuit blocks formed in the main surface of said semiconductor substrate;

an input/output circuit having a plurality of input/output circuit blocks formed in the main surface of said semiconductor substrate; and a pattern of conductors for interconnecting said logic circuit blocks and said input/output circuit blocks, wherein each of said logic circuit blocks includes a plurality of rows of logic cells, each row extending in a first direction substantially parallel with a first pair of opposite sides of the rectangular semiconductor substrate;

each of said input/output circuit blocks includes a plurality of rows of input/output circuit cells, each row extending in said first direction;

said logic circuit blocks and said input/output circuit blocks are juxtaposed alternately in a second direction which is substantially perpendicular to said first direction in the main surface of said semiconductor substrate such that each of said input/output circuit blocks is sandwiched by two adjacently juxtaposed logic circuit blocks.

14. A semiconductor IC device according to claim 13, further comprising a multi-level interconnection structure formed on the main surface of said semiconductor substrate and an array of contacts provided over an outermost surface of said multi-level interconnection structure with a protective layer interposed therebetween, wherein said array of contacts includes first blocks of rows of contacts for input/output signal aligned to extend in said first direction on said protective layer and second blocks of rows of contacts for power supply aligned to extend in said first direction on said protective layer, and said first blocks of rows of said contacts for input/output signal and said second blocks of rows of said contacts for power supply are juxtaposed alternately in said second direction on said protective layer such that each of first blocks of rows of said contacts is sandwiched by two adjacently juxtaposed second blocks of rows of said contacts for power supply on said protective layer.

15. A semiconductor IC device according to claim 13, wherein an electrical connection bump is formed on each of said contacts.

16. A semiconductor IC device according to claim 13, further comprising a memory circuit including a plurality of memory blocks formed in the main surface of said semiconductor substrate, each of said memory blocks being arranged between edges of said semiconductor substrate and said Juxtaposed logic circuit blocks and input/output circuit blocks.

17. A semiconductor integrated circuit device comprising:

(a) a semiconductor substrate having a main surface of rectangular shape, said main surface having a first pair of opposed edges extending in a first direction and a second pair of opposed edges extending in a second direction which is substantially perpendicular to said first direction;

(b) logic circuit blocks formed on said main surface of said semiconductor substrate, each of said logic circuit blocks extending in said first direction and including logic cells arranged in said first direction;

(c) input/output circuit blocks formed on said main surface of said semiconductor substrate, each of said input/output circuit blocks extending in said first direction and including input/output circuit cells arranged in said first direction, said logic circuit blocks and said input/output circuit blocks being juxtaposed alternately in said second direction in said main surface of said semiconductor substrate so that each of said input/output circuit blocks is sandwiched between two adjacently juxtaposed logic circuit blocks;

(d) power supply electrodes for supplying a power source potential to said input/output circuit cells, said power supply electrodes being formed over each of said logic circuit blocks and arranged in said first direction; and (e) power supply wirings extending in said second direction and connected to said power supply electrodes arranged over two adjacent logic circuit blocks, said power supply wirings crossing one of said input/output circuit blocks sandwiched between said two adjacently logic circuit blocks, wherein one of said input/output circuit cells in said one of said input/output circuit blocks is connected to one of said power supply wirings so that said power source potential is supplied to said one of input/output circuit cells via said one of said power supply wirings.

18. A semiconductor integrated circuit device according to claim 17, wherein said input/output circuit cells include emitter coupled logic circuits comprising bipolar transistors.

19. A semiconductor integrated circuit device according to claim 17, wherein each of said input/output circuit blocks comprises two rows of said input/output circuit cells and input/output circuit control signal wirings which are provided to extend in said first direction over said input/output circuit blocks, and wherein one of said input/output circuit control signal wirings is connected to two rows of input/output circuit cells.

20. A semiconductor integrated circuit device according to claim 17, further including reference voltage generating circuits formed on said main surface of said semiconductor substrate, wherein each of said logic circuit blocks includes logic circuit cell units comprising said logic cells arranged in said first direction, wherein said reference voltage generating circuits are provided between said logic circuit cell units and extend in said second direction.

21. A semiconductor integrated circuit device according to claim 20, further including a clock amplifying circuit formed on said main surface of said semiconductor substrate, wherein said clock amplifying circuit comprises a first stage clock amplifier and a second stage clock amplifier in cascade with said first stage clock amplifier, wherein clock signal wirings for connecting said first and second stage clock amplifiers to each other are provided over said reference voltage generating circuits.

* * * * *